(12) United States Patent
Seo et al.

(10) Patent No.: US 12,191,312 B2
(45) Date of Patent: Jan. 7, 2025

(54) LIGHT-EMITTING DEVICE AND ELECTRONIC DEVICE USING THE SAME

(71) Applicant: Semiconductor Energy Laboratory Co., Ltd., Atsugi (JP)

(72) Inventors: Satoshi Seo, Kawasaki (JP); Kaoru Hatano, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/131,905

(22) Filed: Apr. 7, 2023

(65) Prior Publication Data

US 2024/0128272 A1    Apr. 18, 2024

Related U.S. Application Data

(63) Continuation of application No. 17/166,020, filed on Feb. 3, 2021, now Pat. No. 11,631,702, which is a
(Continued)

(30) Foreign Application Priority Data

Jul. 10, 2008    (JP) ................................. 2008-180229

(51) Int. Cl.
*H01L 27/12* (2006.01)
*H01L 33/50* (2010.01)
(Continued)

(52) U.S. Cl.
CPC ...... *H01L 27/1225* (2013.01); *H01L 27/1214* (2013.01); *H01L 27/1218* (2013.01);
(Continued)

(58) Field of Classification Search
CPC .... H10K 59/124; H10K 59/38; H10K 50/125; H10K 50/13; H10K 50/80;
(Continued)

(56) References Cited

U.S. PATENT DOCUMENTS 5,055,899 A    10/1991  Wakai et al.
5,731,856 A     3/1998  Kim et al.
(Continued)

FOREIGN PATENT DOCUMENTS

EP    0924769 A     6/1999
EP    1058484 A    12/2000
(Continued)

OTHER PUBLICATIONS

International Search Report (Application No. PCT/JP2009/062253) Dated Oct. 6, 2009.
(Continued)

*Primary Examiner* — Kevin Quarterman
(74) *Attorney, Agent, or Firm* — Eric J. Robinson; Robinson Intellectual Property Law Office, P.C.

(57) ABSTRACT

A lightweight flexible light-emitting device which is able to possess a curved display portion and display a full color image with high resolution and the manufacturing process thereof are disclosed. The light-emitting device comprises: a plastic substrate; an insulating layer with an adhesive interposed therebetween; a thin film transistor over the insulating layer; a protective insulating film over the thin film transistor; a color filter over the protective insulating film; an interlayer insulating film over the color filter; and a white-emissive light-emitting element formed over the interlayer insulating film and being electrically connected to the thin film transistor.

4 Claims, 8 Drawing Sheets

Related U.S. Application Data continuation of application No. 16/732,748, filed on Jan. 2, 2020, now Pat. No. 10,916,567, which is a continuation of application No. 14/674,346, filed on Mar. 31, 2015, now Pat. No. 10,529,741, which is a continuation of application No. 14/169,553, filed on Jan. 31, 2014, now Pat. No. 9,006,965, which is a continuation of application No. 12/499,271, filed on Jul. 8, 2009, now Pat. No. 8,760,046.

(51) Int. Cl.
  H01L 33/58 (2010.01)
  H10K 59/124 (2023.01)
  H10K 59/38 (2023.01)
  H01L 29/786 (2006.01)
  H10K 50/125 (2023.01)
  H10K 50/13 (2023.01)
  H10K 50/80 (2023.01)
  H10K 59/12 (2023.01)
  H10K 71/80 (2023.01)
  H10K 102/00 (2023.01)

(52) U.S. Cl.
  CPC ........ H01L 27/1266 (2013.01); H01L 33/507 (2013.01); H01L 33/58 (2013.01); H10K 59/124 (2023.02); H10K 59/38 (2023.02); H01L 29/7869 (2013.01); H10K 50/125 (2023.02); H10K 50/13 (2023.02); H10K 50/80 (2023.02); H10K 59/1201 (2023.02); H10K 71/80 (2023.02); H10K 2102/311 (2023.02)

(58) Field of Classification Search
  CPC ............... H10K 59/1201; H10K 71/80; H10K 2102/311; H01L 27/1225; H01L 27/1214; H01L 27/1218; H01L 27/1266; H01L 33/507; H01L 33/58; H01L 29/7869
  See application file for complete search history.

(56) References Cited

U.S. PATENT DOCUMENTS

| | | |
|---|---|---|
| 5,744,864 A | 4/1998 | Cillessen et al. |
| 5,821,622 A | 10/1998 | Tsuji et al. |
| 5,990,542 A | 11/1999 | Yamazaki |
| 5,994,721 A | 11/1999 | Zhong et al. |
| 6,011,274 A | 1/2000 | Gu et al. |
| 6,115,094 A | 9/2000 | Fukunaga |
| 6,153,893 A | 11/2000 | Inoue et al. |
| 6,294,274 B1 | 9/2001 | Kawazoe et al. |
| 6,294,478 B1 | 9/2001 | Sakaguchi et al. |
| 6,346,718 B1 | 2/2002 | Yamanaka et al. |
| 6,365,916 B1 | 4/2002 | Zhong et al. |
| 6,372,608 B1 | 4/2002 | Shimoda et al. |
| 6,392,778 B1 | 5/2002 | Perduijn et al. |
| 6,492,026 B1 | 12/2002 | Graff et al. |
| 6,506,664 B1 | 1/2003 | Beyne et al. |
| 6,521,511 B1 | 2/2003 | Inoue et al. |
| 6,563,174 B2 | 5/2003 | Kawasaki et al. |
| 6,682,963 B2 | 1/2004 | Ishikawa |
| 6,689,492 B1 | 2/2004 | Yamazaki et al. |
| 6,727,522 B1 | 4/2004 | Kawasaki et al. |
| 6,771,028 B1 | 8/2004 | Winters |
| 6,781,152 B2 | 8/2004 | Yamazaki |
| 6,784,457 B2 | 8/2004 | Yamazaki et al. |
| 6,838,818 B2 | 1/2005 | Furugori et al. |
| 6,878,607 B2 | 4/2005 | Inoue et al. |
| 6,933,520 B2 | 8/2005 | Yamazaki |
| 7,005,671 B2 | 2/2006 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,075,242 B2 | 7/2006 | Miller et al. |
| 7,081,704 B2 | 7/2006 | Yamazaki et al. |
| 7,105,868 B2 | 9/2006 | Nause et al. |
| 7,119,364 B2 | 10/2006 | Yamazaki |
| 7,147,530 B2 | 12/2006 | Yamazaki et al. |
| 7,147,740 B2 | 12/2006 | Takayama et al. |
| 7,166,958 B2 | 1/2007 | Furugori et al. |
| 7,184,067 B2 | 2/2007 | Miller et al. |
| 7,189,631 B2 | 3/2007 | Yamazaki et al. |
| 7,211,825 B2 | 5/2007 | Shih et al. |
| 7,229,900 B2 | 6/2007 | Takayama et al. |
| 7,230,374 B2 | 6/2007 | Suh et al. |
| 7,230,594 B2 | 6/2007 | Miller et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,329,985 B2 | 2/2008 | Yamazaki et al. |
| 7,332,381 B2 | 2/2008 | Maruyama et al. |
| 7,339,315 B2 | 3/2008 | Suh et al. |
| 7,385,224 B2 | 6/2008 | Ishii et al. |
| 7,397,180 B2 | 7/2008 | Yamazaki |
| 7,397,485 B2 | 7/2008 | Miller et al. |
| 7,402,506 B2 | 7/2008 | Levy et al. |
| 7,405,432 B2 | 7/2008 | Adachi |
| 7,411,209 B2 | 8/2008 | Endo et al. |
| 7,446,471 B2 | 11/2008 | Furugori et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,525,129 B2 | 4/2009 | Masuda et al. |
| 7,525,165 B2 | 4/2009 | Yamazaki et al. |
| 7,547,612 B2 | 6/2009 | Yamazaki et al. |
| 7,579,203 B2 | 8/2009 | Yamazaki et al. |
| 7,651,896 B2 | 1/2010 | Honda et al. |
| 7,663,140 B2 | 2/2010 | Yamazaki et al. |
| 7,674,650 B2 | 3/2010 | Akimoto et al. |
| 7,696,513 B2 | 4/2010 | Hayashi et al. |
| 7,719,185 B2 | 5/2010 | Jin et al. |
| 7,732,819 B2 | 6/2010 | Akimoto et al. |
| 7,736,758 B2 | 6/2010 | Furugori et al. |
| 7,772,596 B2 | 8/2010 | Nakamura et al. |
| 7,790,299 B2 | 9/2010 | Furugori et al. |
| 7,800,099 B2 | 9/2010 | Yamazaki et al. |
| 7,820,464 B2 | 10/2010 | Yamazaki et al. |
| 7,821,065 B2 | 10/2010 | Murakami et al. |
| 7,851,797 B2 | 12/2010 | Yamazaki et al. |
| 7,910,227 B2 | 3/2011 | Furugori et al. |
| 7,910,490 B2 | 3/2011 | Akimoto et al. |
| 7,915,820 B2 | 3/2011 | Lee et al. |
| 7,923,348 B2 | 4/2011 | Yamazaki et al. |
| 7,923,723 B2 | 4/2011 | Hayashi et al. |
| 7,932,521 B2 | 4/2011 | Akimoto et al. |
| 7,952,103 B2 | 5/2011 | Yamazaki et al. |
| 7,956,349 B2 | 6/2011 | Tsutsui et al. |
| 7,977,168 B2 | 7/2011 | Honda et al. |
| 7,982,215 B2 | 7/2011 | Inoue et al. |
| 8,012,854 B2 | 9/2011 | Yamazaki et al. |
| 8,030,195 B2 | 10/2011 | Inoue et al. |
| 8,034,466 B2 | 10/2011 | Sakata et al. |
| 8,039,288 B2 | 10/2011 | Yamazaki |
| 8,048,251 B2 | 11/2011 | Yamashita et al. |
| 8,076,671 B2 | 12/2011 | Yamazaki et al. |
| 8,098,006 B2 | 1/2012 | Ishizaki et al. |
| 8,134,156 B2 | 3/2012 | Akimoto |
| 8,153,275 B2 | 4/2012 | Hamada et al. |
| 8,158,464 B2 | 4/2012 | Akimoto |
| 8,173,520 B2 | 5/2012 | Yamazaki et al. |
| 8,183,571 B2 | 5/2012 | Yamazaki et al. |
| 8,242,683 B2 | 8/2012 | Abe et al. |
| 8,274,077 B2 | 9/2012 | Akimoto et al. |
| 8,297,991 B2 | 10/2012 | Adachi |
| 8,304,359 B2 | 11/2012 | Yano et al. |
| 8,368,079 B2 | 2/2013 | Akimoto |
| 8,415,679 B2 | 4/2013 | Yamazaki et al. |
| 8,445,962 B2 | 5/2013 | Murakami et al. |
| 8,450,745 B2 | 5/2013 | Yamazaki et al. |

(56) References Cited

U.S. PATENT DOCUMENTS

| | | |
|---|---|---|
| 8,466,482 B2 | 6/2013 | Yamazaki |
| 8,476,665 B2 | 7/2013 | Adachi |
| 8,536,569 B2 | 9/2013 | Yamazaki et al. |
| 8,633,872 B2 | 1/2014 | Osame |
| 8,680,693 B2 | 3/2014 | Kang et al. |
| 8,803,768 B2 | 8/2014 | Kimura et al. |
| 8,847,316 B2 | 9/2014 | Murakami et al. |
| 9,006,965 B2 | 4/2015 | Seo et al. |
| 9,105,521 B2 | 8/2015 | Yamazaki |
| 9,153,604 B2 | 10/2015 | Murakami et al. |
| 9,263,469 B2 | 2/2016 | Yamazaki |
| 9,613,989 B2 | 4/2017 | Yamazaki |
| 10,916,567 B2 | 2/2021 | Seo et al. |
| 2001/0040645 A1 | 11/2001 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0032210 A1 | 2/2003 | Takayama et al. |
| 2003/0040164 A1 | 2/2003 | Inoue et al. |
| 2003/0189401 A1 | 10/2003 | Kido et al. |
| 2003/0218222 A1 | 11/2003 | Wager, III et al. |
| 2003/0230972 A1 | 12/2003 | Cok |
| 2004/0038446 A1 | 2/2004 | Takeda et al. |
| 2004/0061438 A1 | 4/2004 | Yamazaki et al. |
| 2004/0127038 A1 | 7/2004 | Carcia et al. |
| 2004/0145687 A1 | 7/2004 | Kim |
| 2004/0195963 A1 | 10/2004 | Choi et al. |
| 2004/0222736 A1 | 11/2004 | Yoneda |
| 2004/0232413 A1 | 11/2004 | Yamazaki et al. |
| 2004/0257500 A1 | 12/2004 | Kim et al. |
| 2004/0263066 A1 | 12/2004 | Abe et al. |
| 2005/0017302 A1 | 1/2005 | Hoffman |
| 2005/0040400 A1 | 2/2005 | Yamazaki et al. |
| 2005/0062407 A1 | 3/2005 | Suh et al. |
| 2005/0093435 A1 | 5/2005 | Suh et al. |
| 2005/0100760 A1 | 5/2005 | Yokoyama |
| 2005/0199959 A1 | 9/2005 | Chiang et al. |
| 2005/0212416 A1 | 9/2005 | Seo et al. |
| 2005/0242713 A1 | 11/2005 | Yamazaki |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108592 A1 | 5/2006 | Nishimura et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0132461 A1 | 6/2006 | Furukawa et al. |
| 2006/0158104 A1 | 7/2006 | Iijima et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0214008 A1 | 9/2006 | Asami et al. |
| 2006/0228974 A1 | 10/2006 | Thelss et al. |
| 2006/0231882 A1 | 10/2006 | Kim et al. |
| 2006/0232194 A1 | 10/2006 | Tung et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0063646 A1 | 3/2007 | Yamazaki et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0158745 A1 | 7/2007 | Yamazaki et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0081105 A1 | 4/2008 | Suh et al. |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0130278 A1* | 6/2008 | Ushikubo ............ H10K 50/125 362/231 |
| 2008/0143247 A1 | 6/2008 | Kim et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2009/0008639 A1 | 1/2009 | Akimoto et al. |
| 2009/0051273 A1 | 2/2009 | Tsuji et al. |
| 2009/0068773 A1 | 3/2009 | Lai et al. |
| 2009/0072730 A1 | 3/2009 | Choi et al. |
| 2009/0073325 A1 | 3/2009 | Kuwabara et al. |
| 2009/0096364 A1 | 4/2009 | Fujii et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0155940 A1 | 6/2009 | Lee et al. |
| 2009/0186445 A1 | 7/2009 | Akimoto |
| 2009/0189155 A1 | 7/2009 | Akimoto |
| 2009/0189156 A1 | 7/2009 | Akimoto |
| 2009/0239320 A1 | 9/2009 | Takayama et al. |
| 2009/0275196 A1 | 11/2009 | Yamazaki et al. |
| 2009/0278122 A1 | 11/2009 | Hosono et al. |
| 2009/0280600 A1 | 11/2009 | Hosono et al. |
| 2009/0298210 A1 | 12/2009 | Yamazaki et al. |
| 2009/0305461 A1 | 12/2009 | Akimoto et al. |
| 2010/0003783 A1 | 1/2010 | Akimoto |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2011/0089821 A1 | 4/2011 | Furugori et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0159771 A1 | 6/2011 | Yamazaki et al. |
| 2011/0163311 A1 | 7/2011 | Akimoto et al. |
| 2011/0260160 A1 | 10/2011 | Honda et al. |
| 2011/0312111 A1 | 12/2011 | Yamazaki et al. |
| 2012/0037305 A1 | 2/2012 | Yamashita et al. |
| 2012/0211874 A1 | 8/2012 | Yamazaki et al. |
| 2013/0214434 A1 | 8/2013 | Yamazaki et al. |
| 2013/0277679 A1 | 10/2013 | Yamazaki |
| 2013/0286372 A1 | 10/2013 | Adachi |
| 2013/0313558 A1 | 11/2013 | Yamazaki et al. |
| 2014/0346506 A1 | 11/2014 | Kimura et al. |
| 2015/0049279 A1 | 2/2015 | Yamazaki |
| 2017/0062483 A1 | 3/2017 | Kimura et al. |

FOREIGN PATENT DOCUMENTS

| | | |
|---|---|---|
| EP | 1122794 A | 8/2001 |
| EP | 1209748 A | 5/2002 |
| EP | 1399002 A | 3/2004 |
| EP | 1457962 A | 9/2004 |

(56) References Cited

FOREIGN PATENT DOCUMENTS

| | | |
|---|---|---|
| EP | 1473690 A | 11/2004 |
| EP | 1670083 A | 6/2006 |
| EP | 1737044 A | 12/2006 |
| EP | 1777689 A | 4/2007 |
| EP | 1801881 A | 6/2007 |
| EP | 1918904 A | 5/2008 |
| EP | 1933293 A | 6/2008 |
| EP | 2037433 A | 3/2009 |
| EP | 2226847 A | 9/2010 |
| EP | 2261978 A | 12/2010 |
| EP | 3101647 A | 12/2016 |
| EP | 3101691 A | 12/2016 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-268269 A | 10/1998 |
| JP | 11-026733 A | 1/1999 |
| JP | 11-505377 | 5/1999 |
| JP | 2000-044236 A | 2/2000 |
| JP | 2000-150900 A | 5/2000 |
| JP | 2000-353809 A | 12/2000 |
| JP | 2001-052873 A | 2/2001 |
| JP | 2001-175198 A | 6/2001 |
| JP | 2001-290439 A | 10/2001 |
| JP | 2002-031818 A | 1/2002 |
| JP | 2002-076356 A | 3/2002 |
| JP | 2002-289859 A | 10/2002 |
| JP | 2003-068465 A | 3/2003 |
| JP | 2003-086000 A | 3/2003 |
| JP | 2003-086808 A | 3/2003 |
| JP | 2003-115388 A | 4/2003 |
| JP | 2003-174153 A | 6/2003 |
| JP | 2003-204049 A | 7/2003 |
| JP | 2003-308976 A | 10/2003 |
| JP | 2004-094236 A | 3/2004 |
| JP | 2004-103957 A | 4/2004 |
| JP | 2004-273614 A | 9/2004 |
| JP | 2004-273732 A | 9/2004 |
| JP | 2004-288624 A | 10/2004 |
| JP | 2004-311440 A | 11/2004 |
| JP | 2004-327431 A | 11/2004 |
| JP | 2004-334204 A | 11/2004 |
| JP | 2005-026186 A | 1/2005 |
| JP | 2005-063781 A | 3/2005 |
| JP | 2005-100939 A | 4/2005 |
| JP | 2005-140818 A | 6/2005 |
| JP | 2005-157324 A | 6/2005 |
| JP | 2005-267990 A | 9/2005 |
| JP | 2005-308849 A | 11/2005 |
| JP | 2006-012793 A | 1/2006 |
| JP | 2006-040856 A | 2/2006 |
| JP | 2006-512732 | 4/2006 |
| JP | 2006-127985 A | 5/2006 |
| JP | 2006-133573 A | 5/2006 |
| JP | 2006-172762 A | 6/2006 |
| JP | 2006-190993 A | 7/2006 |
| JP | 2007-012369 A | 1/2007 |
| JP | 2007-012815 A | 1/2007 |
| JP | 2007-059310 A | 3/2007 |
| JP | 2007-140490 A | 6/2007 |
| JP | 2007-157470 A | 6/2007 |
| JP | 2007-158304 A | 6/2007 |
| JP | 2007-171932 A | 7/2007 |
| JP | 2007-227288 A | 9/2007 |
| JP | 2007-234431 A | 9/2007 |
| JP | 2007-250982 A | 9/2007 |
| JP | 2007-250984 A | 9/2007 |
| JP | 2007-335214 A | 12/2007 |
| JP | 2008-059824 A | 3/2008 |
| JP | 2008-140684 A | 6/2008 |
| JP | 2009-129711 A | 6/2009 |
| KR | 2001-0078229 A | 8/2001 |
| KR | 2002-0038482 A | 5/2002 |
| KR | 2007-0004974 A | 1/2007 |
| KR | 2007-0095555 A | 10/2007 |
| KR | 2008-0037538 A | 4/2008 |
| KR | 2008-0052107 A | 6/2008 |
| TW | 494447 | 7/2002 |
| TW | 200425486 | 11/2004 |
| TW | 200711525 | 3/2007 |
| TW | 200724702 | 7/2007 |
| TW | 200730985 | 8/2007 |
| TW | 200740283 | 10/2007 |
| WO | WO-2004/061963 | 7/2004 |
| WO | WO-2004/114391 | 12/2004 |
| WO | WO-2005/041249 | 5/2005 |
| WO | WO-2005/107330 | 11/2005 |
| WO | WO-2005/115059 | 12/2005 |
| WO | WO-2006/062218 | 6/2006 |
| WO | WO-2006/090568 | 8/2006 |
| WO | WO-2006/093007 | 9/2006 |
| WO | WO-2007/083918 | 7/2007 |
| WO | WO-2007/108293 | 9/2007 |
| WO | WO-2007/119321 | 10/2007 |
| WO | WO-2007/144995 | 12/2007 |

OTHER PUBLICATIONS

Written Opinion (Application No. PCT/JP2009/062253) Dated Oct. 6, 2009.

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated By TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

(56) References Cited

OTHER PUBLICATIONS

Asakuma.N et al., "Crystallization and Reduction of Sol-Gel-Derived Zinc Oxide Films By Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: the "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper: World-Largest (6.5") Flexible Full Color Top Emission AMOLED Display On Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge To Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for Amlcds", J. Soc. Inf. Display (Journal of the Society for Information Display), 2007, vol. 15, No. 1, pp. 17-22.

Hosono.H, "68.3:Invited Paper: Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis On Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics On Their Way To Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel, YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu, or Zn] At Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

(56) References Cited

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects In ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies In ZnO", Appl. Phys. Lett. (Applied Physics Letters), 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using Castep", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor On SrTiO3 With Sputtered Al2O3 Gate Insulator", Appl. Phys. Lett. (Applied Physics Letters), Sep. 1, 2003, vol. 83, No. 9, pp. 1755-1757.
Korean Office Action (Application No. 2014-7016782) Dated Oct. 10, 2014.
Taiwanese Office Action (Application No. 98123071) Dated Oct. 20, 2014.
Korean Office Action (Application No. 2011-7002622) Dated Nov. 12, 2014.
Korean Office Action (Application No. 2015-7011360) Dated Jun. 2, 2015.
Taiwanese Office Action (Application No. 104135419) Dated Feb. 9, 2017.
Korean Office Action (Application No. 2016-7024533) Dated Mar. 29, 2017.
Taiwanese Office Action (Application No. 106115161) Dated Oct. 19, 2017.

\* cited by examiner

LIGHT-EMITTING DEVICE AND ELECTRONIC DEVICE USING THE SAME

TECHNICAL FIELD

The present invention relates to a light-emitting device which has a circuit including a thin film transistor (hereinafter referred to as a TFT). Further, the present invention relates to an electronic device on which the light-emitting device is mounted.

BACKGROUND ART

In recent years, a technological development has been remarkably made in the field of displays. Especially, the needs of market has stimulated tremendous progress in the technology directed to increase in resolution and thinning of displays.

In a next phase, focus is placed on commercialization of a flexible display having a curved display portion. Indeed, a variety of proposals have been made on manufacturing the flexible display (for example, see Patent Document 1). The use of a flexible substrate enables reduction in weight of a light-emitting device compared with the use of a glass substrate.

However, such a flexible display is also required to have high image quality. A variety of factors influence the image quality. For instance, improvement in resolution is effective for improvement of image quality.

[Patent Document 1] Japanese Patent Laid-Open No. 2003-204049.

DISCLOSURE OF INVENTION

However, a flexible substrate is readily deformed and twisted due to its flexibility. Therefore, an attempt to obtain full color display using a flexible substrate possesses a difficulty in precise and selective formation of light-emitting layers and color filters in an appropriate region of a display portion.

It is an object to supply a flexible light-emitting device which is able to have a curved display portion, has lightweight, and simultaneously can display a full color image with high resolution.

The foregoing problem can be solved by forming an element formation layer comprising a color filter and a thin film transistor over a plane substrate with a plate-like shape, such as a glass substrate, and then forming a white-emissive light-emitting element after transferring the element formation layer to a plastic substrate.

Namely, an embodiment of the invention is a light-emitting device comprising: a plastic substrate; an insulating layer formed over the plastic substrate with an adhesive sandwiched between the plastic substrate and the insulating layer; a thin film transistor formed over the insulating layer; a protective insulating film formed over the thin film transistor; a color filter formed over the protective insulating film; an interlayer insulating film formed over the color filter; and a white-emissive light-emitting element formed over the interlayer insulating film and electrically connected to the thin film transistor. Such a light-emitting device is able to display a full color image with high resolution in spite of its flexibility.

Another embodiment of the invention is a light-emitting device comprising: a plastic substrate; an insulating layer formed over the plastic substrate with an adhesive sandwiched between the plastic substrate and the insulating layer; a thin film transistor formed over the insulating layer; a first protective insulating film formed over the thin film transistor; a color filter formed over the first protective insulating film; a second protective insulating film formed over the color filter; an interlayer insulating film formed over the second protective insulating film; and a white-emissive light-emitting element which is formed over the interlayer insulating film and electrically connected to the thin film transistor. The light-emitting device is able to display a full color image with high resolution in spite of its flexibility. Additionally, the light-emitting device having this structure possesses improved reliability since the white-emissive light-emitting element is protected by the second protective insulating film from a gas released from the color filter.

Note that, in the above-mentioned structure, a light-emitting device is also included in an embodiment of the invention in which patterning of the color filter is performed to allow the color filter to be placed in a position corresponding to a first pixel electrode of the white-emissive light-emitting element, and the first protective insulating film and the second protective insulating film are in contact with each other in a vicinity of the color filter. The light-emitting device allows the white-emissive light-emitting element and the thin film transistor to be effectively protected from contamination resulting from degasification from the color filter and so on. Thus, a light-emitting device with more improved reliability can be obtained.

Note that it is preferred that the above-mentioned protective insulating film is a silicon nitride film because the silicon nitride film is able to more effectively block a contaminant and suppress degasification.

An embodiment of the invention is a light-emitting device comprising: a plastic substrate; a first insulating layer formed over the plastic substrate with an adhesive sandwiched between the plastic substrate and the first insulating layer; a color filter formed over the first insulating layer; a thin film transistor formed over a second insulating layer which is formed so as to cover the color filter; and a white-emissive light-emitting element formed over the thin film transistor and electrically connected to the thin film transistor. Even such a light-emitting device with this structure can be flexible and display a full color image with high resolution.

It is preferred that, in the light-emitting device with the above-mentioned structure, a semiconductor layer of the thin film transistor is formed of amorphous silicon, an organic semiconductor, an oxide semiconductor, or microcrystalline silicon since the thin film transistor is formed after forming the color filter.

The light-emitting devices of the embodiments of the invention can display a full color image with high resolution although they are flexible light-emitting devices.

BEST MODE FOR CARRYING OUT THE INVENTION

Embodiments of the present invention will be described below with reference to the accompanying drawings. However, the present invention can be carried out in many different modes. As is easily known to a person skilled in the art, the mode and the detail of the invention can be variously changed without departing from the spirit and the scope of the invention. Therefore, the present invention is not to be construed with limitation to what is described in the embodiment modes.

DETAILED DESCRIPTION OF THE INVENTION

Embodiment 1

A light-emitting device of an embodiment of the invention is characterized in that an element formation layer comprising a TFT, an electrode of a light-emitting element, and the like is supported by a plastic substrate through an adhesive and that a color filter is provided between the plastic substrate and the light-emitting element.

The light-emitting device having such a structure can be manufactured by the following method and the like. First, the element formation layer including the TFT, the color filter, and a first pixel electrode of the light-emitting element is formed over a substrate with low flexibility, such as a substrate formed of glass, ceramics, and the like, with a separation layer sandwiched between the element formation layer and the substrate. Next, the substrate and the element formation layer are separated from each other at the separation layer, and the separated element formation layer is bonded to the plastic substrate using the adhesive.

As to the light-emitting device manufactured in this way, the color filter is formed using the substrate having low flexibility. Therefore, even in the case of a pixel arrangement directed to a full color display in high resolution, misalignment of the color filter is negligible, which allows the formation of a flexible display capable of displaying a full color image with high resolution.

Note that a protective insulating film may be provided over the color filter in order to reduce adverse influence of degasification from the color filter upon the light-emitting element.

Figure 1A:
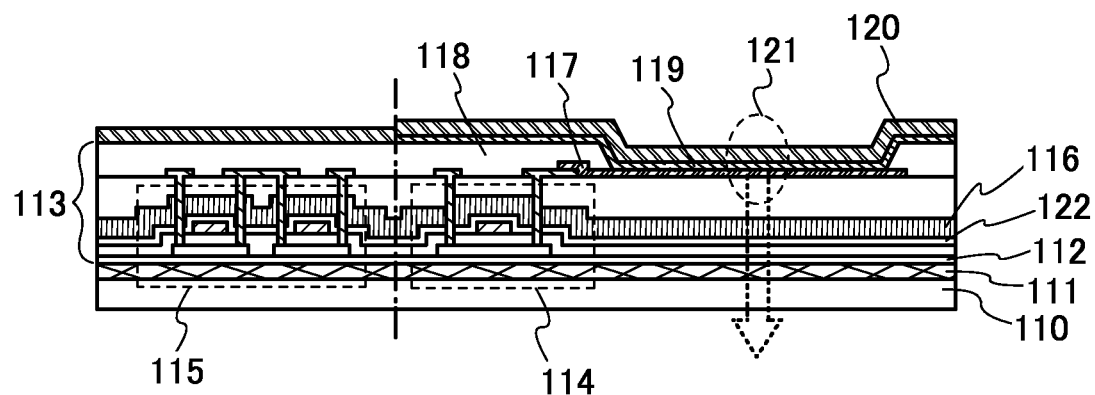
FIGS. 1A to 1C are views each showing a light-emitting device of an embodiment of the invention.
Figure 1B:
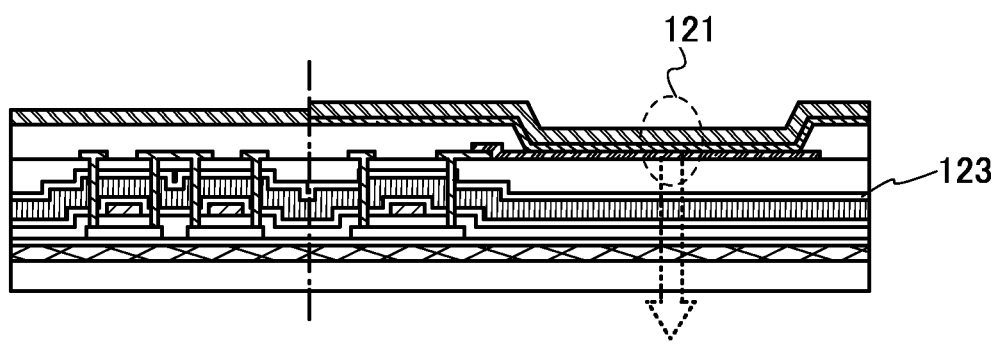
Figure 1C:
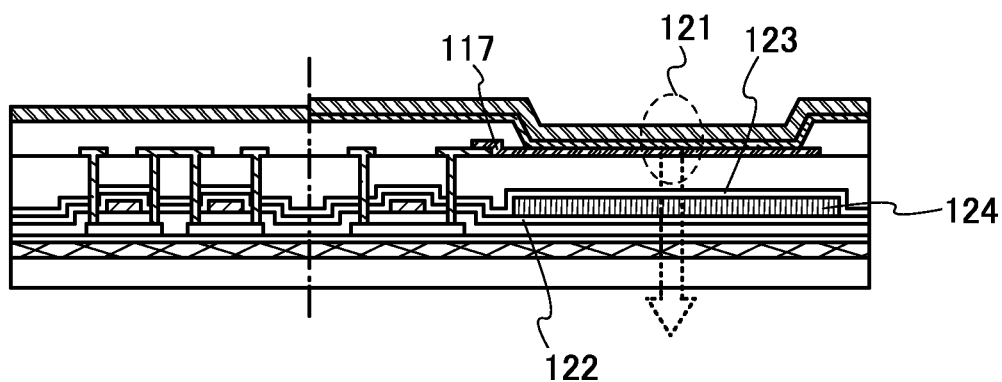

FIGS. 1A to 1C each illustrate a view showing the light-emitting device of the present embodiment.

In the light-emitting device shown in FIG. 1A, an adhesive 111 is provided over a plastic substrate 110. The adhesive 111 is provided so as to be in contact with an insulating layer 112, allowing an element formation layer 113 and the plastic substrate 110 to be bonded to each other. In the element formation layer 113, a pixel TFT 114, a TFT 115 in a driving circuit portion, a color filter 116, a first pixel electrode 117 of a light-emitting element 121 electrically connected to the pixel TFT 114, and a partition layer 118 are provided. FIG. 1A illustrates a part of these members. The light-emitting element 121 is formed of the first pixel electrode 117 exposed from the partition layer 118, an EL layer 119 which overlaps at least the first pixel electrode 117 and contains a light-emitting substance, and a second pixel electrode 120 which overlaps the EL layer 119.

Light emitted from the light-emitting element 121 is preferably red, green, blue, or white. The EL layer 119 and the second pixel electrode 120 of the light-emitting element 121 are formed after the element formation layer 113 is bonded to the plastic substrate 110. Note that since the EL layer 119 and the second pixel electrode 120 of the light-emitting element 121 are formed over all pixels in common, misalignment in the formation thereof does not provide a serious problem although they are formed using the plastic substrate 110.

In the light-emitting devices shown in FIGS. 1A to 1C, the color filter 116 is formed after the TFTs are formed. Note that it is preferred that the color filter 116 is formed over a first protective insulating film 122 which is provided over the TFTs since the first protective insulating film 122 is able to protect the TFTs from a contaminant released from the color filter 116.

FIG. 1B shows a structure in which a second protective insulating film 123 is provided over the color filter 116. This structure enables the production of a light-emitting device with higher reliability because adverse influence of degasification from the color filter 116 upon the light-emitting element 121 can be reduced.

FIG. 1C illustrates a structure in which the color filter 124 is patterned to be located on a position corresponding to the first pixel electrode 117 of the light-emitting element. In this structure, at least in a vicinity of the color filter 124, the first protective insulating film 122 and the second protective insulating film 123 which covers the color filter 124 are in contact with each other, which allows the color filter 124 to be completely surrounded by the protective insulating films. Therefore, diffusion of the contaminant from the color filter 124, such as a gas, can be more effectively prevented. Note that it is preferred that the first protective insulating film 122 and the second protective insulating film 123 are formed by using the same material. Moreover, these protective insulating films are preferably formed by using silicon nitride or silicon oxynitride which has a composition of nitrogen higher than that of oxygen.

Next, a manufacturing process of the light-emitting device of this embodiment is explained with reference to FIGS. 3A to 3D and FIGS. 1A to 1C.

Figure 3A:
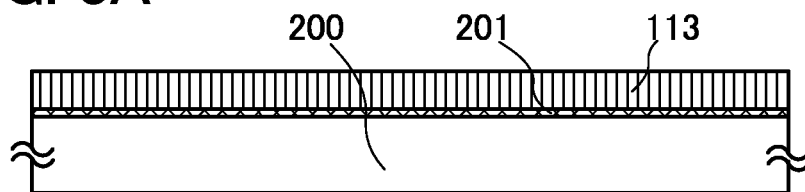
FIGS. 3A to 3D are diagrams showing a manufacturing process of a light-emitting device of an embodiment of the invention.
Figure 3B:
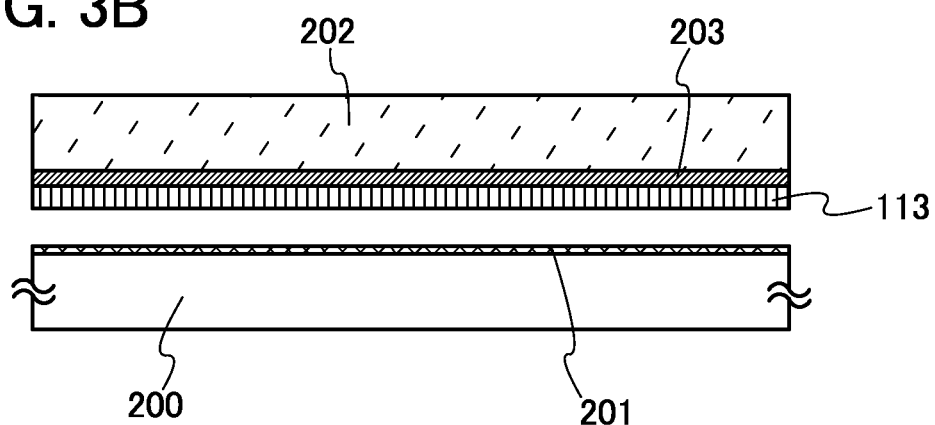

First, the element formation layer 113 comprising the TFT, the color filter, the first pixel electrode, and the like is formed over the substrate 200 having an insulating surface with a separation layer 201 interposed between the element formation layer 113 and the substrate 200 (see, FIG. 3A).

As the substrate 200, a glass substrate, a quartz substrate, a sapphire substrate, a ceramic substrate, a metal substrate over which an insulating layer is formed, and the like can be used. In the manufacturing process of the light-emitting device, the substrate 200 can be selected as appropriate in accordance with the conditions of the process.

Since a substrate with low flexibility, which is frequently used in the manufacture of usual displays, is used as the substrate 200, the pixel TFT and the color filter can be placed in an arrangement suitable for a high-resolution display.

The separation layer 201 is formed by a sputtering method, a plasma CVD method, a coating method, a printing method, or the like, so as to have either a single-layer structure or a stacked structure by using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si); an alloy containing these elements as a main component; or a compound containing these elements as a main component. A crystal structure of a layer containing silicon may be amorphous, microcrystal, or polycrystal. Note that the coating method includes a spin-coating method, a droplet discharge method, a dispensing method, a nozzle printing method, and a slot die coating method in its category here.

In the case that the separation layer 201 has a single-layer structure, it is preferred to form a tungsten layer, a molybdenum layer, a layer containing a mixture of tungsten and molybdenum, a layer containing an oxide or an oxynitride of tungsten, a layer containing an oxide or an oxynitride of molybdenum, or a layer containing an oxide or an oxynitride of a mixture of tungsten and molybdenum as the separation layer 201. Note that the mixture of tungsten and molybdenum corresponds to an alloy of tungsten and molybdenum, for example.

In the case where the separation layer 201 has a stacked structure, a tungsten layer, a molybdenum layer, or a layer containing a mixture of tungsten and molybdenum is formed as a first layer, and a layer containing: an oxide, a nitride, an oxynitride, or a nitride oxide of tungsten; an oxide, a nitride, an oxynitride, or a nitride oxide of molybdenum; or an oxide, a nitride, an oxynitride, or a nitride oxide of a mixture of tungsten and molybdenum is formed as a second layer.

In the case where the stacked layer of a layer containing tungsten and a layer containing an oxide of tungsten is formed as the separation layer 201, the layer containing tungsten may be formed first, which is followed by the formation of an insulating layer formed of an oxide (for example, a silicon oxide layer) over the layer containing tungsten so that a layer containing an oxide of tungsten is formed at the interface between the tungsten layer and the insulating layer. Further, a surface of the tungsten layer may be subjected to thermal oxidation treatment, oxygen plasma treatment, or treatment with a strong oxidizing solution such as water containing ozone to form the layer containing the oxide of tungsten. Further, plasma treatment or heat treatment may be performed in an atmosphere of oxygen, nitrogen, dinitrogen monoxide, or a mixed gas of these gases and another gas. The formation of a layer containing a nitride, an oxynitride, and a nitride oxide of tungsten can be similarly performed. Specifically, after forming the layer including tungsten, an insulating layer formed of a nitride, an oxynitride, or a nitride oxide (for example, a silicon nitride layer, a silicon oxynitride layer, or a silicon nitride oxide layer) is preferably formed over the layer including tungsten.

The insulating layer to be a base can be formed as a single layer or a stacked layer by using an inorganic insulating film such as silicon oxide, silicon nitride, silicon oxynitride, silicon nitride oxide, or the like.

As a material of the semiconductor layer included in the TFT, an amorphous semiconductor (hereinafter referred to as "AS"), a polycrystalline semiconductor, a microcrystalline semiconductor (semiamorphous or microcrystal, hereinafter referred to as "SAS"), a semiconductor which has an organic material as a main component, or the like can be used. The semiconductor layer can be formed by a sputtering method, an LPCVD method, a plasma CVD method, or the like.

Note that the microcrystalline semiconductor belongs to a metastable state which is an intermediate between an amorphous state and a single crystal state according to Gibbs free energy. That is, the microcrystalline semiconductor is a semiconductor having a third state which is stable in terms of free energy and has a short range order and lattice distortion. In the microcrystalline semiconductor, columnar-like or needle-like crystals grow in a normal direction with respect to a surface of a substrate. The Raman spectrum of microcrystalline silicon, which is a typical example of a microcrystalline semiconductor, is shifted to a small wavenumber region below 520 cm$^{-1}$ which corresponds to the wavenumber of the Raman spectrum peak of single-crystalline silicon. That is, the peak of the Raman spectrum of the microcrystalline silicon exists between 520 cm$^{-1}$ which represents single-crystalline silicon and 480 cm$^{-1}$ which represents amorphous silicon. The microcrystalline semiconductor includes at least 1 at. % of hydrogen or halogen to terminate a dangling bond. Moreover, a rare gas element such as helium, argon, krypton, or neon may be included to further promote lattice distortion, so that stability is enhanced and a favorable microcrystalline semiconductor film can be obtained.

The microcrystalline semiconductor film can be formed by a high-frequency plasma CVD method with a frequency of several tens to several hundreds of megahertz or a microwave plasma CVD method with a frequency of 1 GHz or more. Typically, the microcrystalline semiconductor film can be formed by using a gas obtained by diluting a silicon hydride or a silicon halide, such as $SiH_4$, $Si_2H_6$, $SiH_2Cl_2$, $SiHCl_3$, $SiCl_4$, $SiF_4$, or the like, with hydrogen. Additionally, the microcrystalline semiconductor film can be formed by using a gas containing a silicon hydride and hydrogen which is diluted by rare gas elements selected from helium, argon, krypton, and neon. In this case, the flow rate of hydrogen is set to be greater than or equal to 5 times and less than or equal to 200 times, preferably greater than or equal to 50 time and less than or equal to 150 times, much more preferably 100 times as much as that of silicon hydride.

A hydrogenated amorphous silicon can be typically exemplified as the amorphous semiconductor, while a polysilicon or the like can be typically exemplified as a crystalline semiconductor layer. Examples of polysilicon (polycrystalline silicon) include so-called high-temperature polysilicon that contains polysilicon as a main component and is formed at a process temperature greater than or equal to 800° C., so-called low-temperature polysilicon that contains polysilicon as a main component and is formed at a process temperature less than or equal to 600° C., polysilicon obtained by crystallizing amorphous silicon by using an element that promotes crystallization or the like, and the like. Note that as mentioned above, a microcrystalline semiconductor or a semiconductor containing a crystal phase in part of a semiconductor layer may be used.

As a material of the semiconductor, as well as an element of silicon (Si), germanium (Ge), or the like, a compound semiconductor such as GaAs, InP, SiC, ZnSe, GaN, SiGe, or the like can be used. Alternatively, an oxide semiconductor such as zinc oxide, tin oxide, magnesium zinc oxide, gallium oxide, indium oxide, an oxide semiconductor formed of a plurality of the above oxide semiconductors, and the like may be used. For example, an oxide semiconductor formed of zinc oxide, indium oxide, and gallium oxide may be used. In the case of using zinc oxide for the semiconductor layer, a gate insulating film is preferably formed using yttrium oxide, aluminum oxide, titanium oxide, a stack of any of the above substances, or the like. For a gate electrode layer, a source electrode layer, and a drain electrode layer, ITO, Au, Ti, or the like is preferably used. In addition, In, Ga, or the like can be added into zinc oxide.

In the case of using a crystalline semiconductor layer for the semiconductor layer, the crystalline semiconductor layer may be formed by any of various methods (such as a laser crystallization method, a thermal crystallization method, a thermal crystallization method using an element promoting crystallization such as nickel), and the like. Also, a microcrystalline semiconductor, which is an SAS, can be crystallized by irradiating laser light to increase its crystallinity. In a case where an element which promotes crystallization is not used, before the amorphous silicon film is irradiated with a laser beam, the amorphous silicon film is heated at 500° C. for one hour in a nitrogen atmosphere to reduce a hydrogen concentration in the amorphous silicon film to less than or equal to $1 \times 10^{20}$ atoms/cm$^3$. This is because, if the amorphous silicon layer contains much hydrogen, the amorphous silicon layer may be destroyed by laser beam irradiation.

Any method can be used for introducing a metal element into the amorphous semiconductor layer as long as the method allows the metal element to exist on the surface of or inside the amorphous semiconductor layer. For example, a sputtering method, a CVD method, a plasma process method (including a plasma CVD method), an adsorption method, a method of applying a solution of a metal salt, or the like can be used. Among the above-mentioned processes, the method using a solution is convenient and has an advantage of easily adjusting the concentration of a metal element. It is preferable to form an oxide film on the amorphous semiconductor layer by UV light irradiation in an oxygen atmosphere, a thermal oxidation treatment, treatment with ozone water or hydrogen peroxide including a hydroxyl radical, or the like in order to improve wettability of the surface of the amorphous semiconductor layer and to spread the aqueous solution over the entire surface of the amorphous semiconductor layer.

The crystallization may be performed by adding an element which promotes crystallization (also referred to as a catalyst element or a metal element) to an amorphous semiconductor layer and performing a heat treatment (at 550° C. to 750° C. for 3 minutes to 24 hours) in a crystallization step in which the amorphous semiconductor layer is crystallized to form a crystalline semiconductor layer. As the element which promotes (accelerates) the crystallization, one or more of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove or reduce the element promoting crystallization from the crystalline semiconductor layer, a semiconductor layer containing an impurity element is formed in contact with the crystalline semiconductor layer and is made to function as a gettering sink. The impurity element may be an impurity element imparting n-type conductivity, an impurity element imparting p-type conductivity, a rare gas element, or the like. For example, one or a plurality of elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. Specifically, the above-mentioned semiconductor layer containing the impurity element is formed in contact with the crystalline semiconductor layer containing the element which promotes crystallization, and heat treatment (at temperature ranging from 550 to 750° C. for 3 minutes to 24 hours) is performed. The element that promotes crystallization in the crystalline semiconductor layer is transported to the semiconductor layer containing the impurity element; thus, the element that promotes crystallization in the crystalline semiconductor layer is removed or reduced. After that, the semiconductor layer containing the impurity element functioning as the gettering sink is removed.

In addition, thermal treatment and laser light irradiation may be combined to crystallize the amorphous semiconductor layer. The thermal treatment and/or the laser light irradiation may be independently performed a plurality of times.

In addition, a crystalline semiconductor layer may be directly formed over the substrate by a plasma treatment method. Alternatively, the crystalline semiconductor layer may be selectively formed over a substrate by using a plasma treatment method.

As a semiconductor film mainly containing an organic material, a semiconductor film mainly containing carbon can be used. Specifically, pentacene, tetracene, thiophene oligomers, polyphenylenes, phthalocyanine compounds, polyacetylenes, polythiophenes, a cyanine dye, and the like are given as examples.

As to the gate insulating film and the gate electrode, a known structure may be applied, and a known method may be used for the formation thereof. For instance, the gate insulating film may be formed according to a known structure such as a single layer of silicon oxide, a stacked structure of silicon oxide and silicon nitride, and the like. The gate electrode may be formed of an element selected from Ag, Au, Cu, Ni, Pt, Pd, Ir, Rh, W, Al, Ta, Mo, Cd, Zn, Fe, Ti, Si, Ge, Zr, and Ba; or an alloy or a compound containing any of these elements as its main component by using the CVD method, the sputtering method, the droplet discharging method, or the like. Alternatively, a semiconductor film typified by a polycrystalline silicon film doped with an impurity element such as phosphorus, or AgPdCu alloy may be used. Either a single layer structure or a layered structure may be applied.

Note that although an example is shown in FIGS. 1A to 1C in which transistors with a top-gate structure are used, a transistor with a known structure such as a bottom-gate structure and the like may be used.

The first protective insulating film 122 is formed over the gate insulating film and the gate electrode. The first protective insulating film 122 may be formed of a silicon oxide layer, a silicon oxynitride film, a silicon nitride oxide film, or a silicon nitride film, or may be formed as a stacked film in which any of these films are combined. In any case, the first protective insulating film 122 is formed of an inorganic insulating material. The formation of the first protective insulating film 122 allows the reduction of pollution of the TFT caused by the color filter 116 formed later. The use of a silicon nitride film or a silicon nitride oxide film which has a composition of nitrogen higher than that of oxygen is preferred because the contaminant from the color filter 116 can be effectively blocked.

The color filter 116 is formed over the first protective insulating film 122. Although a color filter with a single color is shown in FIGS. 1A to 1C, a color filter which transmits red light, a color filter which transmits blue light, and a color filter which transmits green light are formed in an appropriate arrangement and shape. Any arrangement can be adopted for the arrangement of the color filter 116, including a stripe pattern, a diagonal mosaic arrangement, a triangle mosaic arrangement, an RGBW four pixel arrangement, and the like. The RGBW four pixel arrangement is a pixel arrangement having: a pixel mounted with a color filter transmitting red light; a pixel mounted with a color filter transmitting blue light; a pixel mounted with a color filter transmitting green light; and a pixel without color filter, and is effective in reducing power consumption and so on.

The color filter 116 can be formed by using a known material. In the case of using a photosensitive resin as the color filter 116, patterning of the color filter 116 may be performed by exposing the color filter 116 itself to light and then developed. It is preferred to perform patterning by dry etching when a minute pattern is formed.

After the formation of the color filter 116, an interlayer insulating film formed using an organic insulating material is formed over the color filter 116. As the organic insulating material, an acrylic, a polyimide, a polyamide, a polyimideamide, a benzocyclobutene-based resin, and the like can be used.

The second protective insulating film 123 may be provided between the color filter 116 and the interlayer insulating film in order to suppress the influence of degasification from the color filter 116 (see FIG. 1B). The second protective insulating film 123 can be formed with a similar material to that of the first protective insulating film 122. It is a preferred structure in which the second protective insulating film 123 is formed using a silicon nitride film or a silicon nitride oxide film having a composition of nitrogen higher than oxygen since degasification from the color filter 116 can be effectively suppressed. Note that a structure is preferred in which the first protective insulating film 122 and the second protective insulating film 123 are in contact with each other in a vicinity of the color filter 124 because influence of a contaminant and degasification can be more effectively suppressed (see, FIG. 1C). In this case, the use of the same material for the first protective insulating film 122 and the second protective insulating film 123 allows the improvement of adhesion therebetween, which contributes to further reduction of influence of the contaminant and degasification. The reduction of influence of the contaminant and degasification improves reliability of the light-emitting device.

After the formation of the interlayer insulating film, the first pixel electrode 117 is formed using a transparent conductive film. When the first pixel electrode 117 is an anode, indium oxide, an alloy of indium oxide and tin oxide (ITO), and the like can be used as a material of the transparent conductive film. Alternatively, an alloy of indium oxide and zinc oxide (IZO) may be used. In a similar manner, zinc oxide is also an appropriate material, and moreover, zinc oxide (GZO) to which gallium (Ga) is added to increase conductivity and transmissivity with respect to visible light may be used. When the first pixel electrode 117 is used as a cathode, an extremely thin film of a material with a low work function such as aluminum can be used. Alternatively, a stacked structure which has a thin layer of such a material and the above-mentioned transparent conductive film can be employed. Note that the first pixel electrode 117 can be formed by a sputtering method, a vacuum evaporation method, or the like.

Next, etching is performed on the interlayer insulating film, (the second protective insulating film 123), (the color filter 116), the first protective insulating film 122, and the gate insulating film to result in formation of a contact hole which reaches the semiconductor layer of the TFT. Then a conductive metal film is formed by a sputtering method or a vacuum evaporation method, which is followed by etching to result in an electrode of the TFT and a wiring. One of a source electrode and a drain electrode of the pixel TFT 114 is formed so as to overlap with the first pixel electrode 117 in order to achieve electrical connection therebetween.

After that, an insulating film is formed using an organic insulating material or an inorganic insulating material so that the insulating film covers the interlayer insulating film and the first pixel electrode 117. The insulating film is then processed to allow a surface of the first pixel electrode 117 to be exposed and an end portion of the first pixel electrode 117 to be covered by the insulating film, leading to the formation of the partition layer 118.

Through the above-mentioned process, the element formation layer 113 can be formed.

Next, the element formation layer 113 and a provisional supporting substrate 202 are bonded to each other using a first adhesive 203, which is followed by separation of the element formation layer 113 from the substrate 200 at the separation layer 201. By this process, the element formation layer 113 is placed over the provisional supporting substrate 202 (see, FIG. 3B).

As the provisional supporting substrate 202, a glass substrate, a quartz substrate, a sapphire substrate, a ceramic substrate, a metal substrate on which an insulating surface is formed, and the like can be used. Further, a plastic substrate which can resist a temperature of the manufacturing process of this embodiment or a flexible substrate such as a film may be used.

As the first adhesive 203 used here, an adhesive, which is soluble in a solvent such as water or is capable of plasticizing upon irradiation of UV light, and the like, is used so that the provisional supporting substrate 202 can be chemically or physically separated from the element formation layer 113 when necessary.

Any of following methods can be applied in the transferring process from the substrate 200 to the provisional supporting substrate 202: forming the separation layer 201 between the substrate 200 and the element formation layer 113, forming a metal oxide film between the separation layer 201 and the element formation layer 113, embrittling the metal oxide film by crystallizing thereof, and separating the element formation layer 113; forming an amorphous silicon film containing hydrogen between the substrate 200 having high thermal resistivity and the element formation layer 113, removing the amorphous silicon film by irradiation with laser light or etching, and separating the element formation layer 113; forming the separation layer 201 between the substrate 200 and the element formation layer 113, forming a metal oxide film between the separation layer 201 and the element formation layer 113, embrittling the metal oxide film by crystallizing thereof, removing a part of the separation layer 201 by etching using a solution or a halogen fluoride gas such as $NF_3$, $BrF_3$, $ClF_3$, and the like, and performing the separation at the embrittled metal oxide film; and removing the substrate 200 over which the element formation layer 113 is formed mechanically or by etching using a solution or a halogen fluoride gas such as $NF_3$, $BrF_3$, $ClF_3$, and the like. Alternatively, a method may be used in which a film containing nitrogen, oxygen, or hydrogen (for example, an amorphous silicon film containing hydrogen, an alloy film containing hydrogen, or an alloy film containing oxygen) is used as the separation layer 201, and the separation layer 201 is irradiated with laser light to release the nitrogen, oxygen, or hydrogen contained in the separation layer 201, thereby promoting separation between the element formation layer 113 and the substrate 200.

When the above-described separation methods are combined, the transfer step can be conducted easily. For example, separation can be performed with physical force (by a machine and the like) after performing: laser light irradiation; etching to the separation layer 201 with a gas, a solution, or the like; and mechanical removal with a sharp knife, scalpel, or the like, so that the separation layer 201 and the element formation layer 113 can be easily peeled off from each other.

Alternatively, separation of the element formation layer 113 from the substrate 200 may be carried out after penetrating a liquid into an interface between the separation layer 201 and the element formation layer 113.

Figure 3C:
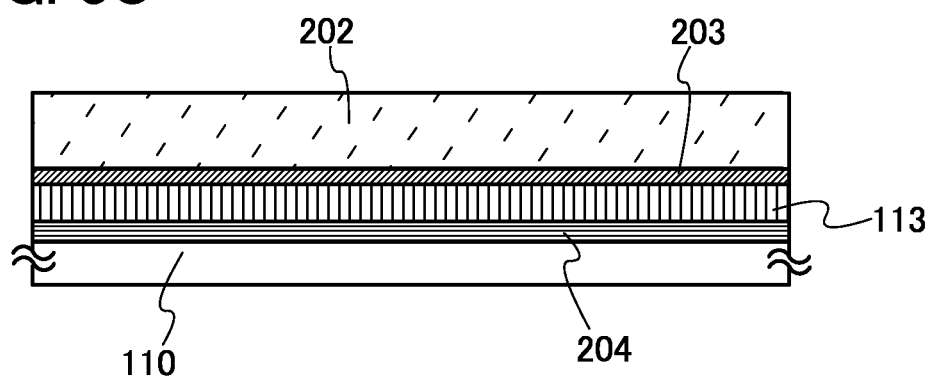
Figure 3D:
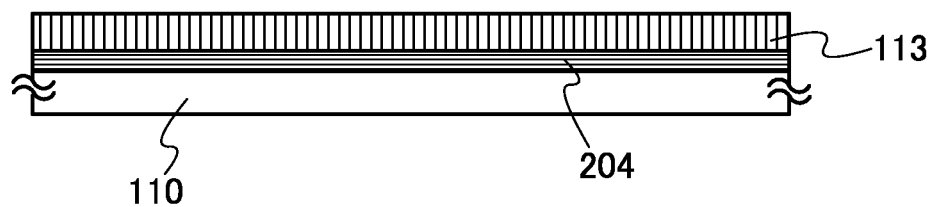

Next, the element formation layer 113 which is separated from the substrate 200 to expose the separation layer 201 or the insulating layer 112 is bonded to the plastic substrate 110 using a second adhesive 204 which is different from the first adhesive 203 (see, FIG. 3C).

As the second adhesive 204, various curable adhesives such as a reactive curable adhesive, a thermal curable adhesive, a photo curable adhesive such as an ultraviolet curable adhesive, an anaerobic adhesive, and the like can be used.

As the plastic substrate 110, a variety of substrates having flexibility and light-transmitting ability, a film of an organic resin, and the like can be used. The plastic substrate 110 may be a structure body comprising a fibrous body and an organic resin. It is preferred to use the structure body comprising the fibrous body and the organic resin as the plastic substrate 110 since resistivity to the breaking caused by bending is improved, and thus, reliability is increased.

The structure body comprising the fibrous body and the organic resin can be used as a film which can simultaneously function as the second adhesive 204 and the plastic substrate 110. In this case, as the organic resin of the structure body, a resin such as a reactive curable resin, a thermosetting resin, and a photo curable resin, and the like whose curing is promoted by an additional treatment are preferably used.

After the bonding of the plastic substrate 110 to the element formation layer 113, the provisional supporting substrate 202 is removed by dissolving or plasticizing the first adhesive 203. After the provisional supporting substrate 202 is removed, the first adhesive 203 is removed using a solvent such as water to allow a surface of the first pixel electrode 117 of the light-emitting element to be exposed (see, FIG. 3D).

Through the above-mentioned process, the element formation layer 113, which comprises the color filter 116, the TFTs 114 and 115, the first pixel electrode 117 of the light-emitting element, and the like, can be manufactured over the plastic substrate 110.

After the surface of the first pixel electrode 117 is exposed, the EL layer 119 is formed. A stacked structure of the EL layer 119 is not particularly limited. A layer containing a substance having high electron-transporting ability, a layer containing a substance having high hole-transporting ability, a layer containing a substance having high electron injection ability, a layer containing a substance having high hole injection ability, a layer containing a bipolar substance (a substance having high electron-transporting ability and high hole transporting ability), and the like are appropriately combined. For example, an appropriate combination of a hole injecting layer, a hole-transporting layer, a light-emitting layer, an electron-transporting layer, an electron injection layer, and the like can be performed. In this embodiment, a structure is explained in which the EL layer 119 comprises a hole injection layer, a hole-transporting layer, a light-emitting layer, and an electron-transporting layer. Specific materials to form each of the layers are given below.

The hole injection layer is a layer that is provided in contact with an anode and contains a material with high hole injection ability. Specifically, molybdenum oxide, vanadium oxide, ruthenium oxide, tungsten oxide, manganese oxide, or the like can be used. Alternatively, the hole injection layer can be formed using any one of the following materials: phthalocyanine compounds such as phthalocyanine ($H_2PC$) and copper phthalocyanine (CuPc); aromatic amine compounds such as 4,4'-bis[N-(4-diphenylaminophenyl)-N-phenylamino]biphenyl (DPAB) and 4,4'-bis(N-{4-[N-(3-methylphenyl)-N-phenylamino]phenyl}-N-phenylamino) biphenyl (DNTPD); polymer compounds such as poly(3,4-ethylenedioxythiophene)/poly(styrenesulfonic acid) (PEDOT/PSS); and the like.

Alternatively, as the hole injection layer, a composite material comprising a substance with high hole-transporting ability and an acceptor substance may be used. It is to be noted that, by using the composite material comprising the substance with high hole-transporting ability and the acceptor substance, a material used to form an electrode may be selected regardless of its work function. In other words, besides a material with a high work function, a material with a low work function may also be used as the anode. As the acceptor substance, 7,7,8,8-tetracyano-2,3,5,6-tetrafluoroquinodimethane (abbreviation: $F_4$-TCNQ), chloranil, and the like can be given. In addition, a transition metal oxide is given. In addition, oxides of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of a high electron accepting property. Among these metal oxides, molybdenum oxide is especially preferable since it can be easily treated due to its stability in the air and low hygroscopic property.

As the substance having high hole-transporting ability used for the composite material, any of various organic compounds such as an aromatic amine compound, a carbazole derivative, an aromatic hydrocarbon, and a high-molecular compound (such as an oligomer, a dendrimer, or a polymer) can be used. The organic compound used for the composite material preferably has a hole mobility of $10^{-6}$ $cm^2/Vs$ or higher is preferably used. However, other materials than these materials may also be used as long as hole-transporting ability is higher than electron-transporting ability. The organic compound that can be used for the composite material is specifically shown below.

Examples of the aromatic amine compounds include N,N'-di(p-tolyl)-N,N'-diphenyl-p-phenylenediamine (abbreviated to DTDPPA), 4,4'-bis[N-(4-diphenylaminophenyl)-N-phenylamino]biphenyl (abbreviated to DPAB), 4,4'-bis(N-{4-[N-(3-methylphenyl)-N-phenylamino]phenyl}-N-phenylamino)biphenyl (abbreviated to DNTPD), 1,3,5-tris [N-(4-diphenylaminophenyl)-N-phenylamino]benzene (abbreviated to DPA3B), and the like.

Examples of a carbazole derivative include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphtyl)-N-(9-phenylcarbazol-3-yl) amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbons include 2-tert-butyl-9,10-di(2-naphthyl)anthracene (t-BuDNA), 2-tert-butyl-9,10-di(1-naphthyl)anthracene, 9,10-bis(3,5-diphenylphenyl)anthracene (DPPA), 2-tert-butyl-9,10-bis(4-phenylphenyl)anthracene (t-BuDBA), 9,10-di(2-naphthyl)

anthracene (DNA), 9,10-diphenylanthracene (DPAnth), 2-tert-butylanthracene (t-BuAnth), 9,10-bis(4-methyl-1-naphthyl)anthracene (DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl) anthracene, 2,3,6,7-tetramethyl-9,10-di(2-naphthyl) anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. As well as these compounds, pentacene, coronene, or the like can be used. Note that when a film of the above-mentioned aromatic hydrocarbons is formed by an evaporation method, the number of the carbon atoms participating in their condensed ring preferably ranges from 14 to 42 from the viewpoint of the evaporation behavior of the aromatic hydrocarbons and the quality of the formed film.

The aromatic hydrocarbon that can be used for the composite material may have a vinyl skeleton. As an aromatic hydrocarbon having a vinyl group, for example, 4,4'-bis(2,2-diphenylvinyl)biphenyl (abbreviation: DPVBi), 9,10-bis [4-(2,2-diphenylvinyl)phenyl]anthracene (abbreviation: DPVPA), and the like are given.

The polymeric compounds are exemplified by poly(N-vinylcarbazole) (abbreviated to PVK), poly(4-vinyltriphenylamine) (abbreviated to PVTPA), poly[N-(4-{N'-[4-(4-diphenylamino)phenyl]phenyl-N'-phenylamino}phenyl) methacrylamide] (abbreviated to PTPDMA), poly[N,N'-bis (4-butylphenyl)-N,N'-bis(phenyl)benzidine] (abbreviated to Poly-TPD), and the like.

The hole-transporting layer is a layer that contains a substance with high hole-transporting ability. Examples of the substance having high hole-transporting ability include aromatic amine compounds such as 4,4'-bis[N-(1-naphthyl)-N-phenylamino]biphenyl (abbr.: NPB), N,N-bis(3-methylphenyl)-N,N'-diphenyl-[1,1'-biphenyl]-4,4'-diamine (abbr.: TPD), 4,4',4"-tris(N,N-diphenylamino)triphenylamine (abbr.: TDATA), 4,4',4"-tris[N-(3-methylphenyl)-N-phenylamino]triphenylamine (abbr.: MTDATA), 4,4'-bis[N-(spiro-9,9'-bifluoren-2-yl)-N-phenylamino]biphenyl (abbr.: BSPB), and the like. The materials described here are mainly substances having hole mobility of $10^{-6}$ cm$^2$/Vs or more. However, a material other than the above-described substances may be used as long as it has higher hole-transporting ability than electron-transporting ability. Note that the layer containing the substance with high hole-transporting ability is not limited to a single layer, and two or more layers containing the aforementioned substances may be stacked.

Further, a high molecular compound such as poly(N-vinylcarbazole) (abbr.: PVK) or poly(4-vinyltriphenylamine) (abbr.: PVTPA) can also be used for the hole-transporting layer.

The light-emitting layer is a layer containing a light-emitting substance. The light-emitting layer may be a so-called single layer light-emitting layer and a so-called host-guest type light-emitting layer in which a light-emitting substance is dispersed in a host material, as long as the emission from the light-emitting layer is located in the visible region. For example, followings are provided as the light-emitting layer: a light-emitting layer containing a light-emitting substance having a broad emission spectrum (see, FIG. 6A); a light-emitting layer containing a plurality of light-emitting substances having a different emission wavelength region (see, FIG. 6B); a light-emitting layer containing a plurality of layers which each include a light-emitting substance with a different emission wavelength region (see, FIG. 6C); and the like. These structures may be combined to each other. Note that in FIGS. 6A to 6C, a reference numeral 600 represents the first pixel electrode of the light-emitting element; a reference numeral 601 represents a second pixel electrode of the light-emitting element; a reference numeral 602 represents the EL layer; reference numerals 603, 603-1, and 603-2 each represent the light-emitting layer; and reference numerals 604, 604-1, and 604-2 each represent the light-emitting substance.

Figure 6A:
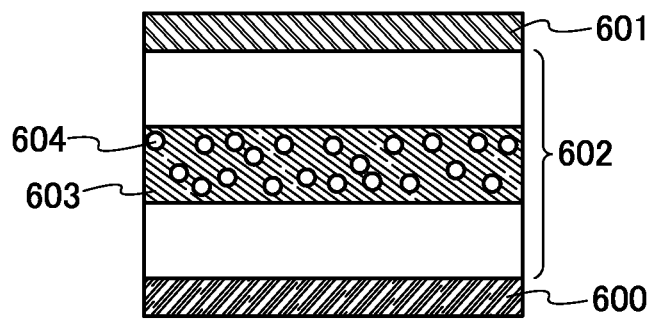
FIGS. 6A to 6C are views each explaining a structure of a light-emitting layer.
Figure 6B:
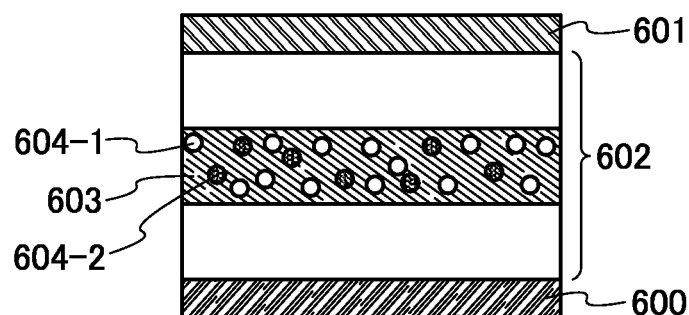
Figure 6C:
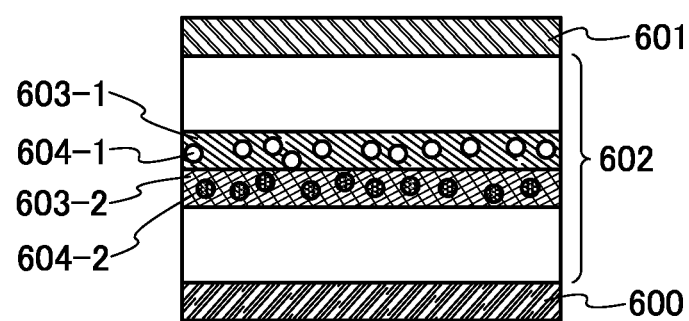

In the case of the structures shown in FIGS. 6B and 6C, a combination of the light-emitting substances (corresponding to the light-emitting substances 604-1 and 604-2, but being not limited to two kinds of substances) with different wavelength regions is generally exemplified by a combination of two kinds of light-emitting substances which emit light of complementary colors to each other (for example, blue light and yellow light) or by a combination of three kinds of substances with red, blue and green emission colors.

Figure 7A:
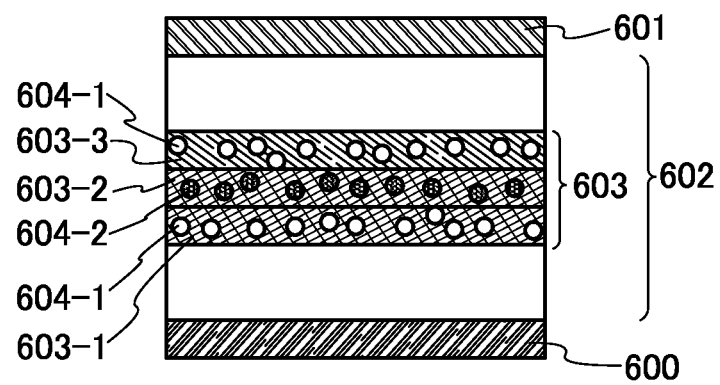
FIGS. 7A and 7B are views each explaining a structure of a light-emitting layer.

In the case of the combination of two kinds of light-emitting substances with complementary emission colors in the structure shown in FIG. 6C, it is preferred to employ a structure in which, as shown in FIG. 7A, a three-layer structure containing a first light-emitting layer 603-1, a second light-emitting layer 603-2, and a third light-emitting layer 603-3 in that order from a side of the first pixel electrode 600 is provided as the light-emitting layer 603; and a layer (the second light-emitting layer 603-2) containing a light-emitting substance 604-2 capable of emitting light with a long wavelength is interposed between layers (the first light-emitting layer 603-1 and the third light-emitting layer 603-3) each containing a light-emitting substance 604-1 capable of emitting light with a short wavelength. Note that, in the structure of FIG. 7A, carrier-transporting ability of each of the light-emitting layers is tuned by appropriately selecting host materials to allow recombination of electrons and holes to occur in the vicinity of an interface of the layer (the second light-emitting layer 603-2) containing the light-emitting substance 604-2 which is located on the side of the second pixel electrode 601 (i.e., an interface between the second light-emitting layer 603-2 and the third light-emitting layer 603-3). By using such structure, the lifetime of the light-emitting element can be improved, and the emission from the light-emitting substance capable of emitting light with the long wavelength and that from the light-emitting substance capable of emitting light with the short wavelength can be readily balanced.

Here, in the case where the first pixel electrode 600 and the second pixel electrode 601 are used as the anode and the cathode, respectively, "recombination of holes and electrons in the vicinity of an interface of the layer, containing the light-emitting substance capable of emitting light with the long wavelength, the interface of which is located on the side of the second pixel electrode, by tuning carrier transporting ability of each of the light-emitting layers through the appropriate selection of the host materials" can be achieved by designing the light-emitting element so that the layer (the third light-emitting layer 603-3), which is located on the side of second pixel electrode 601 and contains the light-emitting substance 604-1 capable of emitting light with short wavelength, has electron-transporting ability and the layer (the first light-emitting layer 603-1), which is located on the anode side and contains the light-emitting substance 604-1 capable of emitting light with the short wavelength, and the layer (the second light-emitting layer 603-2), which contains the light-emitting substance 604-2 capable of emitting light with the long wavelength, have hole-transporting ability. When the first pixel electrode 600 and the second pixel electrode 601 are used as the cathode and the anode, respectively, the combination concerning the carrier-transporting ability is reversed.

As a result, electrons, which cannot participate to recombination in the vicinity of the cathode side interface (the interface between the second light-emitting layer 603-2 and the third light-emitting layer 603-3) of the layer (the second light-emitting layer 603-2) containing the light-emitting substance capable of emitting light with the long wavelength, are provided with an opportunity to undergo recombination in the layer (the first light-emitting layer 603-1) which is located on the anode side and contains the light-emitting substance capable of emitting light with the short wavelength. Thus, deterioration resulting from a phenomenon that a carrier (electron or hole) reaches to a carrier-transporting layer which has carrier-transporting ability opposite to the respective carrier can be retarded, which contributes to improvement in lifetime of the light-emitting element.

Energy obtained by recombination of holes and electrons is readily transferred from a substance which emits light with a short wavelength to a substance which emits light with a long wavelength. In such a case, light emitted from the substance which emits light with the long wavelength is enhanced, which makes it difficult to balance the intensities of emissions from the substance which emits light with the short wavelength and from the substance which emits light with the long wavelength. However, by using the above-mentioned structure, the electron which fails to participate to recombination in the vicinity of the interface between the second light-emitting layer 603-2 and the third light-emitting layer 603-3 can be subjected to recombination in the layer (the first light-emitting layer 603-1) which is located on the anode side and contains the light-emitting substance capable of emitting light with the short wavelength. Thus, a well balanced emission is attainable, and an emission with desired color can be obtained.

In such a structure, when an anthracene derivative, which has electron-transporting ability as well as hole-transporting ability, is used as a host material of the first light-emitting layer 603-1 and the second light-emitting layer 603-2 in which a light-emitting substance is dispersed, the effect of improving the lifetime is more effectively obtained.

Figure 7B:
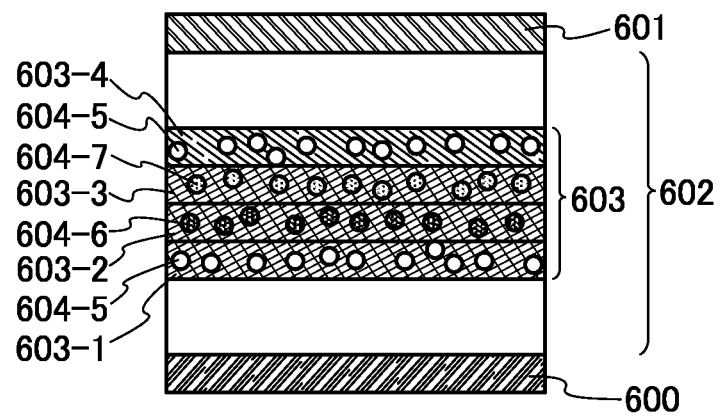

When three kinds of light-emitting substances, i.e., red, blue, and green-emissive light-emitting substances, are combined in the structure shown in FIG. 6C, it is preferred, as shown in FIG. 7B, to employ a structure in which a light-emitting layer 603 is formed as a four-layer structure containing, from the side of the first pixel electrode 600, a first light-emitting layer 603-1, a second light-emitting layer 603-2, a third light-emitting layer 603-3, and a fourth light-emitting layer 603-4 and in which the layer (the third light-emitting layer 603-3) containing a green-emissive light-emitting substance 604-7 and the layer (the second light-emitting layer 603-2) containing a red-emissive light-emitting substance 604-6 are sandwiched between the layers (the first light-emitting layer 603-1 and the fourth light-emitting layer 603-4) containing a blue-emissive light-emitting substance 604-5. Note that, in the structure shown in FIG. 7B, carrier-transporting ability of each of the light-emitting layers is tuned to allow the region for recombination of holes and electrons to be located in the vicinity of the interface between the cathode-side layer (the fourth light-emitting layer 603-4) containing the blue-emissive light-emitting substance 604-5 and the layer (the third light-emitting layer 603-3) containing the green-emissive light-emitting substance 604-7. By using such structure, the lifetime of the light-emitting element can be improved, and the emission from the light-emitting substance capable of emitting light with the long wavelength and that from the light-emitting substance capable of emitting light with the short wavelength can be readily balanced.

Note that, when the first pixel electrode 600 and the second pixel electrode 601 are respectively the anode and cathode, recombination in the vicinity of the interface between the fourth light-emitting layer 603-4 and the third light-emitting layer 603-3 can be achieved by designing the light-emitting element so that: the cathode-side layer (the fourth light-emitting layer 603-4) containing the blue-emissive light-emitting substance 604-5 has electron-transporting ability; and the layer (the third light-emitting layer 603-3) containing the green-emissive light-emitting substance 604-7, the layer (the second light-emitting layer 603-2) containing the red-emissive light-emitting substance 604-6, and the anode-side layer (the first light-emitting layer 603-1) containing the blue-emissive light-emitting substance 604-5 have hole-transporting ability. When the first pixel electrode 600 and the second pixel electrode 601 are the cathode and the anode, respectively, the carrier-transporting ability of each layer is reversed. Note that carrier-transporting ability of each of the light-emitting layers can be determined by carrier-transporting ability of the substance which is contained at the highest composition in the corresponding light-emitting layers.

As a result, electrons, which cannot participate to recombination in the vicinity of the interface between the cathode-side layer (the fourth light-emitting layer 603-4) containing the blue-emissive light-emitting substance 604-5 and the layer (the third light-emitting layer 603-3) containing the green-emissive light-emitting substance 604-7, are provided with an opportunity to undergo recombination in the anode-side layer (the first light-emitting layer 603-1) containing the blue-emissive light-emitting substance 604-5. Thus, deterioration resulting from a phenomenon that a carrier (electron or hole) reaches to a carrier-transporting layer which has carrier-transporting ability opposite to the respective carrier can be retarded, which contributes to improvement in lifetime of the light-emitting element.

Energy obtained by recombination of holes and electrons is readily transferred from a substance which emits light with a short wavelength to a substance which emits light with a long wavelength. In such a case, light emitted from the substance which emits light with the long wavelength is enhanced, which makes it difficult to balance the intensities of emissions from the substance which emits light with the short wavelength and from the substance which emits light with the long wavelength. However, by using the above-mentioned structure, the electron which once fails to participate to recombination is subjected to recombination in the anode-side layer (the first light-emitting layer 603-1) containing the blue-emissive light-emitting substance 604-5, giving an emission of light with the short wavelength. Thus, a well-balanced emission is attainable, and an emission with desired color can be obtained.

The light-emitting substance used is not particularly limited, and known fluorescent substances or phosphorescent substances can be used. As fluorescent substances, for example, in addition to N,N'-bis[4-(9H-carbazol-9-yl)phenyl]-N,N'-diphenylstilbene-4,4'-diamine (abbreviation: YGA2S) and 4-(9H-carbazol-9-yl)-4'-(10-phenyl-9-anthryl)triphenylamine (abbreviation: YGAPA), and the like, there are fluorescent substances with an emission peak equal to or greater than 450 nm, such as 4-(9H-carbazol-9-yl)-4'-(9,10-diphenyl-2-anthryl)triphenylamine (abbreviation:

2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N,N-triphenyl-1,4-phenylenediamine (abbreviation: 2DPAPPA), N,N,N',N',N'',N''',N'''',N''''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,13-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM). As phosphorescent substances, for example, in addition to bis[2-(4',6'-difluorophenyl)pyridinato-N,$C^{2'}$]iridium(III)tetrakis(1-pyrazolyl)borate (abbreviation: FIr6), there are phosphorescent substances with an emission wavelength in the range of 470 nm to 500 nm, such as bis[2-(4',6'-difluorophenyl)pyridinato-N,$C^{2'}$]iridium(III)picolinate (abbreviation: FIrpic), bis[2-(3',5'bistrifluoromethylphenyl)pyridinato-N,$C^{2'}$]iridium(III)picolinate (abbreviation: Ir(CF$_3$ppy)$_2$(pic)), and bis[2-(4',6'-difluorophenyl)pyridinato-N, $C^{2'}$]iridium(III)acetylacetonate (abbreviation: FIracac); phosphorescent materials with an emission wavelength equal to or greater than 500 nm (materials which emit green light), such as tris(2-phenylpyridinato)iridium(III) (abbreviation: Ir(ppy)$_3$), bis(2-phenylpyridinato)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), tris(acetylacetonato)(monophenanthroline)terbium(III) (abbreviation: Tb(acac)$_3$(Phen)), bis(benzo[h]quinolinato)iridium(III)acetylacetonate (abbreviation: Ir(bzq)$_2$(acac)), bis(2,4-diphenyl-1,3-oxazolato-N,$C^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$(acac)), bis[2-(2'-benzo[4,5-α]thienyl)pyridinato-N,$C^{3'}$]iridium(III)acetylacetonate (abbreviation: Ir(btp)$_2$(acac)), bis(1-phenylisoquinolinato-N,$C^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphyrinatoplatinum(II) (abbreviation: PtOEP), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)). The light-emitting substances can be selected from the above-mentioned materials or other known materials in consideration of emission colors (or peak wavelengths of an emission) of each of the light-emitting layers.

When the host material is used, the following can be given: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)-tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as NPB (or α-NPD), TPD, and BSPB. In addition, condensed polycyclic aromatic compounds such as anthracene derivatives, phenanthrene derivatives, pyrene derivatives, chrysene derivatives, and dibenzo[g,p]chrysene derivatives are given. The following is specifically given as the condensed polycyclic aromatic compound: 9,10-diphenylanthracene (DPAnth); N,N-diphenyl-9-[4-(10-phenyl-9-anthryl)phenyl]-9H-carbazol-3-amine (CzA1PA); 4-(10-phenyl-9-anthryl)triphenylamine (DPhPA); 4-(9H-carbazol-9-yl)-4'-(10-phenyl-9-anthryl)triphenylamine (YGAPA); N,9-diphenyl-N-[4-(10-phenyl-9-anthryl)phenyl]-9H-carbazol-3-amine (PCAPA); N,9-diphenyl-N-{4-[4-(10-phenyl-9-anthryl)phenyl]phenyl}-9H-carbazol-3-amine (PCAPBA); N-9-diphenyl-N-(9,10-diphenyl-2-anthryl)-9H-carbazol-3-amine (2PCAPA); 6,12-dimethoxy-5,11-diphenylchrysene, N,N,N',N',N'',N''',N'''',N''''-octaphenyldibenzo[g,p]chrysene-2,7,10,15-tetramine (DBC1); 9-[4-(10-phenyl-9-anthryl)phenyl]-9H-carbazole (CzPA); 3,6-diphenyl-9-[4-(10-phenyl-9-antryl)phenyl]-9H-carbazole (DPCzPA), 9,10-bis(3,5-diphenylphenyl)anthracene (DPPA), 9,10-di(2-naphthyl)anthracene (DNA), 2-tert-butyl-9,10-di(2-naphthyl)anthracene (t-BuDNA), 9,9'-bianthryl (BANT), 9,9'-(stilbene-3,3'-diyl)diphenanthrene (DPNS), 9,9'-(stilbene-4,4'-diyl)diphenanthrene (DPNS2), 3,3',3''-(benzene-1,3,5-triyl)tripyrene (TPB3) and the like. From these substances or other known substances, the host material may be selected so that the host material has a larger energy gap (or a triplet energy if the light-emitting substance emits phosphorescence) than the light-emitting substance dispersed in the light-emitting layer and has carrier-transporting ability required for each of the light-emitting layers.

The electron-transporting layer is a layer that contains a substance with high electron-transporting ability. For example, a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq) can be used. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)-benzothiazolato]zinc (abbreviation: Zn(BTZ)$_2$) can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances described here are mainly those having electron mobility of $10^{-6}$ cm$^2$/Vs or more. It is to be noted that a substance other than the above substances may be used as long as it has higher electron-transporting ability than hole transporting ability.

Further, the electron-transporting layer may be formed as not only a single layer but also as a stacked layer in which two or more layers formed using the above mentioned substances are stacked.

Further, a layer for controlling transport of electron may be provided between the electron-transporting layer and the light-emitting layer. Note that the layer for controlling transport of electron is a layer in which a small amount of a substance having high electron-trapping ability is added to a layer containing the above-mentioned substances having high electron-transporting ability. The layer for controlling transport of electron controls transport of electron, which enables adjustment of carrier balance. Such a structure is very effective in suppressing a problem (such as shortening of element lifetime) caused by a phenomenon that electron passes through the light-emitting layer.

Further, an electron injection layer may be provided so as to be in contact with an electrode functioning as a cathode. As the electron injection layer, alkali metal, alkaline earth metal, or a compound of thereof such as lithium fluoride (LiF), cesium fluoride (CsF), calcium fluoride (CaF$_2$), and the like can be employed. For example, a layer which contains both a substance having electron-transporting ability and an alkali metal, an alkaline earth metal, or a compound thereof (a layer of Alq including magnesium (Mg) for example) can be used. Note that electron can be efficiently injected from the cathode by using, as the electron injection layer, a substance having electron-transporting ability to which an alkali metal or an alkaline earth metal is mixed.

When the second pixel electrode 601 is used as the cathode, a metal, an alloy, an electrically conductive compound, a mixture thereof, or the like having a low work function (specifically, work function of smaller than or equal to 3.8 eV), can be used as a substance for the second pixel electrode 601. As a specific example of such a cathode material, an element belonging to Group 1 or Group 2 in the periodic table, i.e., an alkali metal such as lithium (Li) or cesium (Cs), an alkaline earth metal such as magnesium (Mg), calcium (Ca), or strontium (Sr); an alloy containing any of these metals (such as MgAg or AlLi); a rare earth metal such as europium (Eu) or ytterbium (Yb); an alloy containing such a rare earth metal; or the like can be used. However, when the electron injection layer is provided between the cathode and the electron-transporting layer, any of a variety of conductive materials such as Al, Ag, ITO, and indium oxide-tin oxide containing silicon or silicon oxide, and the like can be used regardless of its work function as the cathode. Films of these electrically conductive materials can be formed by a sputtering method, an ink-jet method, a spin coating method, or the like.

It is preferable that, when the second pixel electrode 601 is used as the anode, the second pixel electrode 601 is formed using a metal, an alloy, or a conductive compound, a mixture thereof, or the like having a high work function (specifically greater than or equal to 4.0 eV). Specifically, an example thereof is indium oxide-tin oxide (ITO: indium tin oxide), indium oxide-tin oxide containing silicon or silicon oxide, indium oxide-zinc oxide (IZO: indium zinc oxide), indium oxide containing tungsten oxide and zinc oxide (IWZO), or the like. Such conductive metal oxide films are usually formed by a sputtering method, but may also be formed by using a sol-gel method or the like. For example, indium zinc oxide (IZO) can be formed by a sputtering method using a target in which 1 to 20 wt % of zinc oxide is added to indium oxide. Indium oxide containing tungsten oxide and zinc oxide (IWZO) can be formed by a sputtering method using a target in which 0.5 wt % to 5 wt % of tungsten oxide and 0.1 wt % to 1 wt % of zinc oxide are contained in indium oxide. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal (such as titanium nitride), or the like can be given. By forming the above-mentioned composite material so as to be in contact with the anode, a material for the anode can be selected regardless the magnitude of its work function.

Figure 8:
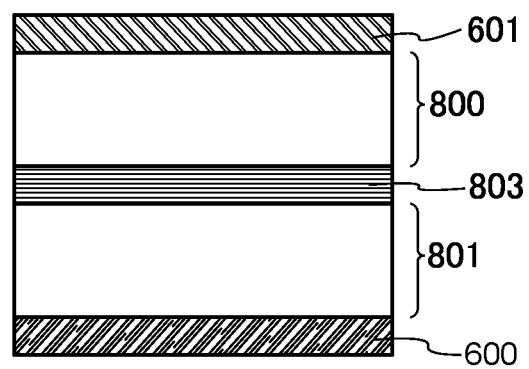
FIG. 8 is a view explaining a structure of a light-emitting element.

Note that, as to the above-mentioned EL layer, a plurality of EL layer may be formed between the first pixel electrode 600 and the second pixel electrode 601 as shown in FIG. 8. In this case, a charge generation layer 803 is preferably provided between the stacked EL layers 800 and 801. The charge generation layer 803 can be formed by using the above-mentioned composite material. Further, the charge generation layer 803 may have a stacked structure comprising a layer containing the composite material and a layer containing another material. In this case, as the layer containing another material, a layer containing an electron donating substance and a substance with high electron-transporting ability, a layer comprising a transparent conductive material, and the like can be used. Such a structure allows the formation of a light-emitting element with high emission efficiency and a long lifetime. Moreover, a light-emitting element which provides a phosphorescent emission from one of the EL layers and a fluorescent emission from the other of the EL layers can be readily obtained. Note that this structure can be combined with the above-mentioned structures of the EL layer. For instance, the EL layer having the structure of FIG. 6C and the EL layer having the structure of FIG. 6A can be stacked. Specifically, it is readily achieved to obtain blue and green fluorescent emissions from the EL layer 800 having the structure of FIG. 6C and simultaneously obtain a red phosphorescent emission from the EL layer 801 having the structure of FIG. 6A, where the charge generation layer 803 is sandwiched therebetween. In a similar way, green and red phosphorescent emissions are obtained from the EL layer 800 having the structure of FIG.

6C, and a blue fluorescent emission is simultaneously obtained from the EL layer 801 having the structure of FIG. 6A, where the charge generation layer 803 is sandwiched therebetween. In particular, the structure which provides the green and red phosphorescent emissions and the blue fluorescent emission is preferred since a white emission with well-balanced emission efficiencies of the EL layers is attainable.

Through the above-mentioned process, the light-emitting devices shown in FIGS. 1A to 1C can be obtained.

Figure 4A:
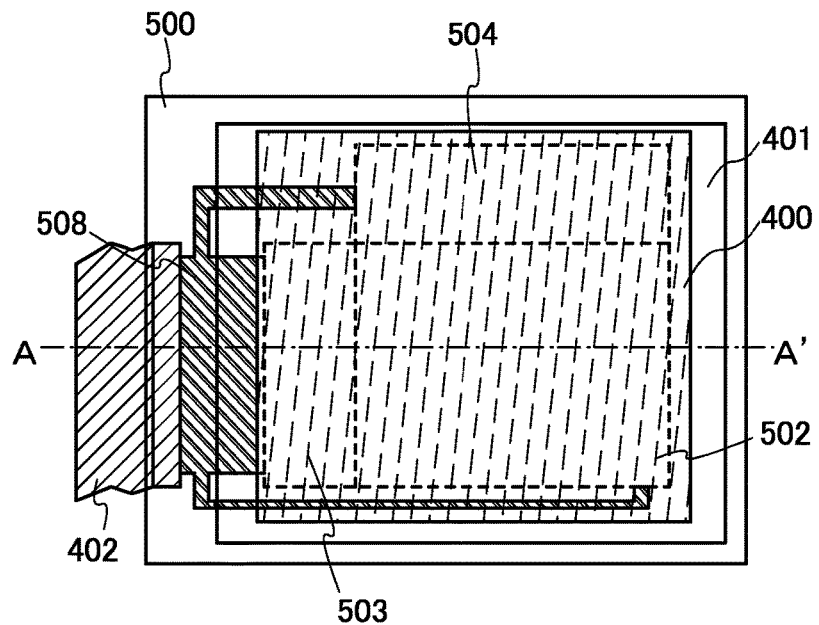
FIGS. 4A and 4B are views showing a light-emitting device of an embodiment of the invention.
Figure 4B:
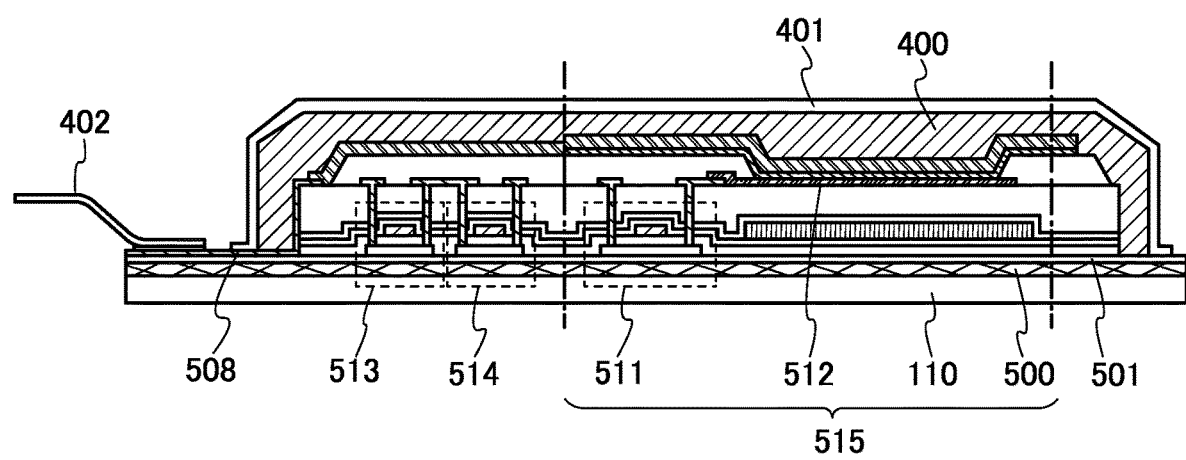

After the formation of the element formation layer and the light-emitting layer, it is preferred to seal the light-emitting element with an organic resin 400, a protective film 401, and the like as shown in FIGS. 4A and 4B in order to prevent a substance which promotes deterioration of the EL layer from entering from the outside. A sealing substrate may be used instead of the organic resin 400 and the protective film 401. However, the protective film 401 is not necessarily formed over input and output terminals which are connected to an FPC and the like later.

Since the light-emitting device of the present embodiment displays an image toward the plastic substrate 110 side through the color filter, it is possible to use the above-mentioned organic resin 400, the protective film 401, and the sealing substrate even if they are colored or have low transmissivity with respect to visible light. In the case where the organic resin 400, the protective film 401, and the sealing substrate each are formed using light-transmitting materials, a monochromic image can be also supplied from the sealing substrate side if the second pixel electrode is formed by a light-transmitting material or in a shape which allows visible light to be transmitted therethrough. A material similar to that for the plastic substrate 110 can be used for the sealing substrate.

Next, the FPC 402 is bonded to each of electrodes of the input and output terminals with an anisotropic conductive material. An IC chip may be mounted thereover if necessary.

By the above-mentioned process, manufacture of a module of the light-emitting device to which the FPC 402 is connected is completed.

Figure 2:
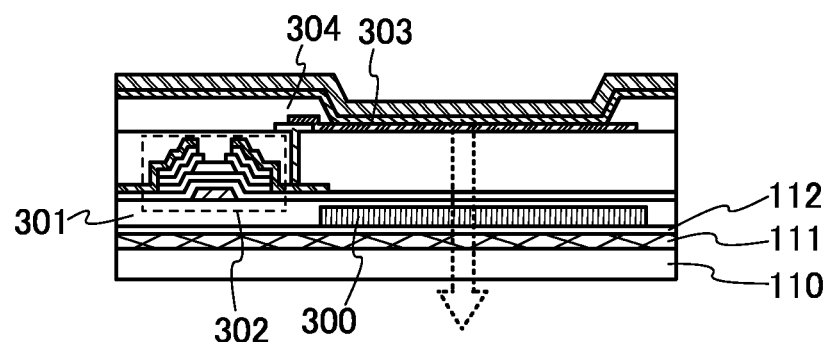
FIG. 2 is a view showing a light-emitting device of an embodiment of the invention.

Note that, in the case where the semiconductor layer of the TFT included in the light-emitting device of the present embodiment is not subjected to treatment performed at a high-temperature or a laser irradiation, a structure shown in FIG. 2 can be employed.

In the structure shown in FIG. 2, an adhesive 111 is provided over a plastic substrate 110 and bonds an element formation layer formed over a first insulating layer 112 to the plastic substrate 110. A color filter 300 is provided over the first insulating layer 112, and a TFT 302 is provided while a second insulating layer 301 formed over the color filter 300 is sandwiched between the color filter 300 and the TFT 302. The second insulating layer 301 can be formed by using an inorganic insulating material such as silicon oxide, silicon oxynitride, silicon nitride, silicon nitride oxide, and the like or an organic insulating material such as an acrylic, a polyimide, and the like. The use of the organic insulating material is preferred since the organic insulating material can reduce a step caused by formation of the color filter 300. Furthermore, it is preferred to provide a protective insulating film over the second insulating layer 301 in order to suppress an adverse influence of contaminant, such as a gas released from the color filter 300, upon the TFT 302. The protective insulating film is preferably formed using an inorganic insulating material such as silicon oxide, silicon oxynitride, silicon nitride, silicon nitride oxide, and the like. In particular, it is preferred to use silicon nitride or silicon nitride oxide which has a composition of nitrogen higher than that of oxygen. Note that the protective insulating film is not necessarily provided in the case where the second insulating layer 301 is formed by an inorganic insulating film.

As shown in FIGS. 1A to 1C, after a separation layer and the first insulating layer 112 are formed, the color filter 300 and the second insulating layer 301 are formed over a substrate with low flexibility, which is followed by the formation of the TFT 302. The TFT 302 may have a known structure and be formed by a known method which does not require high temperature treatment. For instance, a TFT having a semiconductor such as the above-mentioned microcrystalline semiconductor, the amorphous semiconductor, the oxide semiconductor, the semiconductor containing an organic material as a main component, and the like is exemplified. After forming the TFT 302, a first pixel electrode 303 of a light-emitting element and a partition layer 304 are formed. Then, the separation is carried out in a similar manner to that mentioned above to achieve the transfer to a plastic substrate 110, leading to the formation of a light-emitting device similarly to that shown in FIGS. 1A to 1C.

In the light-emitting device with such a structure, the second insulating layer 301 is singly able to suppress adverse influence of a contaminant from the color filter 300 upon the TFT 302 and the light-emitting element, which contributes to reduction of manufacturing process.

It should be noted that even in the structure shown in FIG. 2, the color filter is formed using the substrate with low flexibility. Therefore, similarly to the structure shown in FIGS. 1A to 1C, the light-emitting device with the structure of FIG. 2 can display a full color image with high resolution in spite of its flexibility.

Embodiment 2

A top view and a sectional view of a module of a light-emitting device (also referred to as an EL module) are illustrated in FIGS. 4A and 4B, respectively.

FIG. 4A is a top view showing the EL module, and FIG. 4B is a view showing a part of a cross section taken along line A-A' of FIG. 4A. In FIG. 4A, an insulating layer 501 is formed over a plastic substrate 110 with an adhesive 500 (for example, the second adhesive and the like) sandwiched therebetween, over which a pixel portion 502, a source side driving circuit 504, and a gate side driving circuit 503 are formed. These elements can be obtained by the manufacturing method demonstrated in embodiment 1.

Reference numerals 400 and 401 denote an organic resin and a protective film, respectively, and the pixel portion 502, the source side driving circuit 504, and the gate side driving circuit 503 are covered by the organic resin 400 which is further covered by the protective film 401. Sealing by a cover material can be further conducted by using an adhesive. The cover material can be bonded as a supporting base before the separation process.

A reference numeral 508 denotes a wiring for transmitting signals inputted to the source side driver circuit 504 and the gate side driver circuit 503 and receives video signals, clock signals, and the like from an FPC (Flexible Printed Circuit) 402 which functions as an external input terminal. Although only the FPC 402 is depicted in FIGS. 4A and 4B, a printed wiring board (PWB) may be provided to the FPC 402. The light-emitting device according to the embodiments of the invention includes not only a light-emitting device itself but also a state in which an FPC or a PWB is attached thereto.

Next, a sectional structure is described with reference to FIG. 4B. The insulating layer 501 is provided over and in contact with the adhesive 500, and the pixel portion 502 and the gate side driving circuit 503 are formed over the insulating layer 501. The pixel portion 502 comprises a plurality of pixels 515, and the plurality of pixels 515 include a current control TFT 511 and a first pixel electrode 512 which is electrically connected to one of source and drain electrodes of the current control TFT 511. Although FIG. 4B shows only one of the plurality of pixels 515, they are arranged in a matrix form in the pixel portion 502. The gate side driver circuit 503 is formed using a CMOS circuit in which a plurality of n-channel TFTs 513 and a plurality of p-channel TFTs 514 are combined.

Embodiment 3

In this embodiment, electronic devices which include the light-emitting devices described in embodiments 1 and 2 are described.

Examples of the electronic devices which include the light-emitting devices described in embodiments 1 or 2 include cameras such as video cameras and digital cameras, goggle type displays, navigation systems, audio playback devices (e.g., car audio systems and audio systems), computers, game machines, portable information terminals (e.g., mobile computers, mobile phones, portable game machines, and electronic books), image playback devices in which a recording medium is provided (specifically, devices that are capable of playing back recording media such as digital versatile discs (DVDs) and equipped with a display unit that can display images), and the like. Specific examples of such electronic devices are shown in FIGS. 5A to 5D.

Figure 5A:
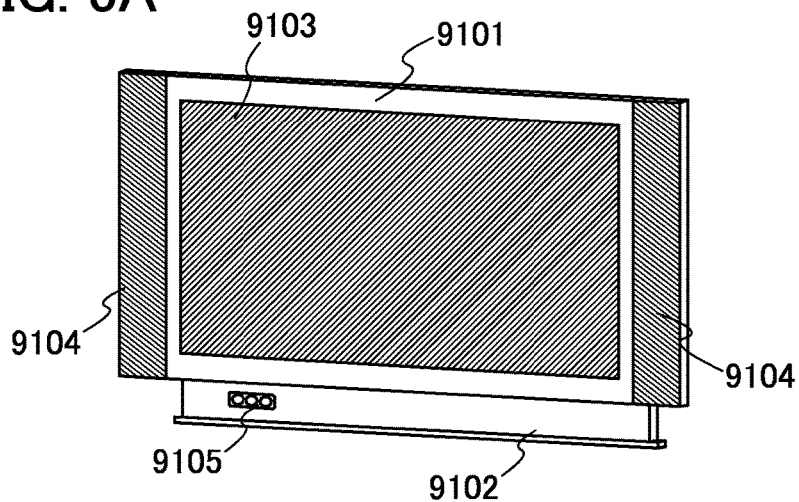
FIGS. 5A to 5E are views each showing an electronic device according to an embodiment of the invention.

FIG. 5A illustrates a television device which includes a housing 9101, a supporting base 9102, a display portion 9103, speaker portions 9104, video input terminals 9105, and the like. The television device is manufactured by using the light-emitting device shown in embodiment 1 or 2 in the display portion 9103. The television device, in which the flexible light-emitting device capable of displaying a full color image with high resolution is mounted, allows the display portion 9103 to possess a curved shape, is lightweight, and supplies an image with high quality.

Figure 5B:
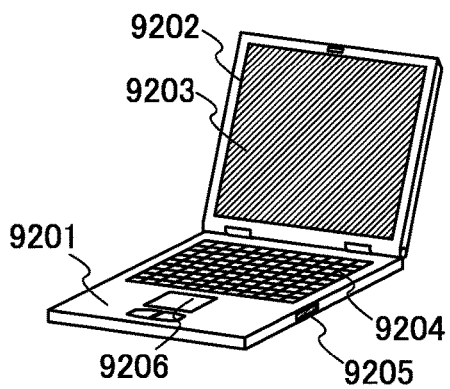

FIG. 5B illustrates a computer which includes a main body 9201, a housing 9202, a display portion 9203, a keyboard 9204, an external connection port 9205, a pointing device 9206, and the like. The computer is manufactured by using the light-emitting device shown in embodiment 1 or 2 in the display portion 9203. The computer, in which the flexible light-emitting device capable of displaying a full color image with high resolution is mounted, allows the display portion 9203 to possess a curved shape, is lightweight, and supplies an image with high quality.

Figure 5C:
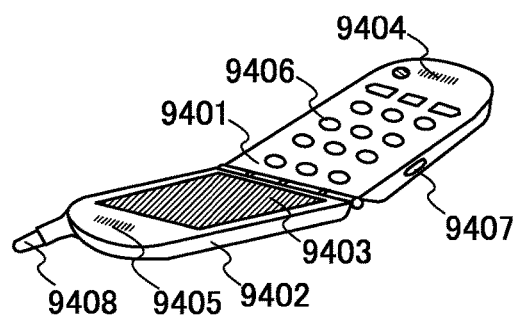

FIG. 5C illustrates a mobile phone, which includes a main body 9401, a housing 9402, a display portion 9403, an audio input portion 9404, an audio output portion 9405, operation keys 9406, an external connection port 9407, an antenna 9408, and the like. The mobile phone is manufactured by using the light-emitting device shown in embodiment 1 or 2 in the display portion 9403. The mobile phone, in which the flexible light-emitting device capable of displaying a full color image with high resolution is mounted, allows the display portion 9403 to possess a curved shape, is lightweight, and supplies an image with high quality. In addition, the lightweight mobile phone can have appropriate weight even if a variety of additional values are added thereto, and thus the mobile phone is suitable as a highly functional mobile phone.

Figure 5D:
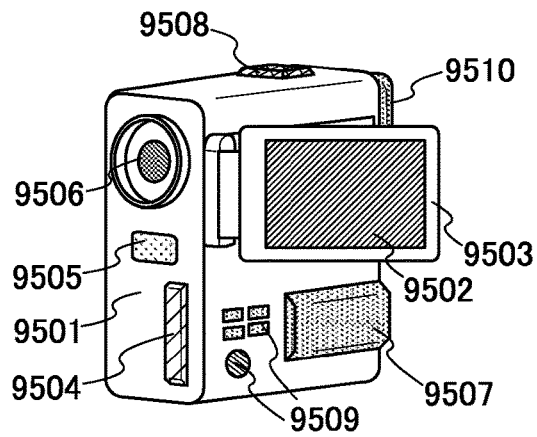

FIG. 5D illustrates a camera which includes a main body 9501, a display portion 9502, a housing 9503, an external connecting port 9504, a remote control receiving portion 9505, an image receiving portion 9506, a battery 9507, an audio input portion 9508, operation keys 9509, an eyepiece portion 9510, and the like. The camera is manufactured by using the light-emitting device shown in embodiment 1 or 2 in the display portion 9502. The camera, in which the flexible light-emitting device capable of displaying a full color image with high resolution is mounted, allows the display portion 9502 to possess a curved shape, is lightweight, and supplies an image with high quality.

Figure 5E:
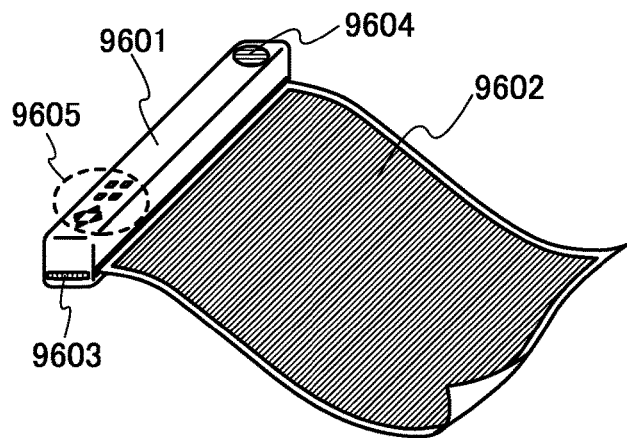

FIG. 5E illustrates a flexible display which includes a main body 9601, a display portion 9602, an insert portion of an external memory 9603, a speaker portion 9604, operation keys 9605, and the like. A television receiving antenna, an external input, an external output terminal, a battery, and the like may be mounted on the main body 9601. The flexible display is manufactured by using the light-emitting device shown in embodiment 1 or 2 in the display portion 9602. The display portion 9602 can possess a curved shape, is lightweight, and supplies an image with high quality. When the display portions of the electronic devices shown in FIGS. 5A to 5D are manufactured so as to have a curved shape and the flexible display shown in FIG. 5E is mounted on the display portions, a electronic device having a display portion with a curved shape can be supplied.

As described above, the range of application of the light-emitting device manufactured by using the light-emitting element shown in embodiment 1 or 2 is extremely wide, and the light-emitting device can be applied to electronic devices in a wide variety of fields.

This application is based on Japanese Patent Application serial no. 2008-180229 filed with Japan Patent Office on Jul. 10, 2008, the entire contents of which are hereby incorporated by reference.

What is claimed is:

1. A light-emitting device comprising:
    a transistor over a substrate, the transistor comprising an oxide semiconductor;
    a light-emitting element over the transistor; and
    a color filter overlapping with the light-emitting element,
    wherein the light-emitting element comprises:
        a first light-emitting layer comprising a first light-emitting substance;
        a second light-emitting layer over the first light-emitting layer, the second light-emitting layer comprising a second light-emitting substance;
        a third light-emitting layer over the second light-emitting layer, the third light-emitting layer comprising a third light-emitting substance; and
        a fourth light-emitting layer over the third light-emitting layer, the fourth light-emitting layer comprising a fourth light-emitting substance, and
    wherein the second light-emitting layer and the third light-emitting layer are adjacent to each other without an electrode therebetween.

2. The light-emitting device according to claim 1, wherein the oxide semiconductor comprises indium, gallium, and zinc.

3. A light-emitting device comprising:
    a transistor over a substrate, the transistor comprising an oxide semiconductor;
    a light-emitting element over the transistor; and a color filter overlapping with the light-emitting element,
wherein the light-emitting element comprises:
- a first light-emitting layer comprising a first light-emitting substance;
- a second light-emitting layer over the first light-emitting layer, the second light-emitting layer comprising a second light-emitting substance;
- a third light-emitting layer over the second light-emitting layer, the third light-emitting layer comprising a third light-emitting substance;
- a fourth light-emitting layer over the third light-emitting layer, the fourth light-emitting layer comprising a fourth light-emitting substance; and
- an anode and a cathode, wherein the second light-emitting layer and the third light-emitting layer are adjacent to each other without an electrode therebetween, and wherein the first light-emitting layer, the second light-emitting layer, the third light-emitting layer, and the fourth light-emitting layer are positioned between the anode and the cathode.

4. The light-emitting device according to claim 3, wherein the oxide semiconductor comprises indium, gallium, and zinc.

* * * * *